(12) United States Patent
Ohta et al.

(10) Patent No.: US 8,359,923 B2
(45) Date of Patent: Jan. 29, 2013

(54) PHYSICAL QUANTITY SENSOR

(75) Inventors: Tameharu Ohta, Takahama (JP); Tetsuo Fujii, Toyohashi (JP); Masanobu Azukawa, Anjo (JP); Takeshi Ito, Okazaki (JP); Itaru Ishii, Okazaki (JP)

(73) Assignees: Denso Corporation, Kariya (JP); Toyota Jidosha Kabushiki Kaisha, Toyota (JP)

( * ) Notice: Subject to any disclaimer, the term of this patent is extended or adjusted under 35 U.S.C. 154(b) by 3 days.

(21) Appl. No.: 12/926,970

(22) Filed: Dec. 21, 2010

(65) Prior Publication Data

US 2011/0094303 A1 Apr. 28, 2011

Related U.S. Application Data

(63) Continuation of application No. 12/453,485, filed on May 12, 2009, now Pat. No. 7,891,244.

(51) Int. Cl.
*G01P 15/125* (2006.01)
(52) U.S. Cl. .................................................. 73/514.32
(58) Field of Classification Search .................. None
See application file for complete search history.

(56) References Cited

U.S. PATENT DOCUMENTS

| | | | |
|---|---|---|---|
| 6,182,508 B1 | 2/2001 | Takeuchi et al. | |
| 6,199,429 B1 | 3/2001 | Hirosawa | |
| 7,234,364 B2 | 6/2007 | Ohta | |
| 7,464,590 B1 | 12/2008 | Hotelling et al. | |
| 2002/0158390 A1 | 10/2002 | Braman et al. | |
| 2004/0232507 A1 | 11/2004 | Furukubo et al. | |
| 2005/0257615 A1 | 11/2005 | Ohta | |
| 2006/0005624 A1 | 1/2006 | Hirano | |
| 2006/0070440 A1* | 4/2006 | Challoner et al. | 73/504.12 |
| 2009/0064785 A1* | 3/2009 | Fukuda et al. | 73/514.32 |

FOREIGN PATENT DOCUMENTS

| | | |
|---|---|---|
| JP | A-2000-314628 | 11/2000 |
| JP | A-2002-071353 | 3/2002 |
| JP | A-2002-257552 | 9/2002 |
| JP | A-2007-33393 | 2/2007 |
| JP | A-2007-27238 | 3/2007 |
| JP | A-2007-170910 | 7/2007 |
| JP | A-2007-212174 | 8/2007 |
| JP | A-2008-051729 | 3/2008 |

OTHER PUBLICATIONS

Office Action mailed Mar. 8, 2011 issued in the corresponding Japanese Application No. 2009-79103 (English translation enclosed).
Office Action dated Jun. 25, 2010 issued in U.S. Appl. No. 12/453,485.
Notice of Allowance dated Oct. 14, 2010 issued in U.S. Appl. No. 12/453,485.
Office Action issued from the Japanese Patent Office on Dec. 7, 2010 in the corresponding Japanese patent application No. 2009-079103 (English translation thereof).

* cited by examiner

*Primary Examiner* — Robert R Raevis
(74) *Attorney, Agent, or Firm* — Posz Law Group, PLC

(57) ABSTRACT

A physical quantity sensor includes a sensor portion, a casing, and a vibration isolator. The casing includes a supporting portion with a supporting surface that is located to face an end surface of the sensor portion. The vibration isolator is located between the end surface of the sensor portion and the supporting surface of the casing to join the sensor portion to the casing. The vibration isolator reduces a relative vibration between the sensor portion and the casing.

6 Claims, 24 Drawing Sheets

PHYSICAL QUANTITY SENSOR

CROSS REFERENCE TO RELATED APPLICATION

This application is a continuation of U.S. patent application Ser. No. 12/453,485 filed on May 12, 2009 now U.S. Pat. No. 7,891,244 and entitled PHYSICAL QUANTITY SENSOR AND METHOD OF MAKING THE SAME, and is based on and incorporates herein by reference Japanese Patent Application No. 2008-125843 filed on May 13, 2008, No. 2009-3456 filed on Jan. 9, 2009, and No. 2009-79103 filed on Mar. 27, 2009.

FIELD OF THE INVENTION

The present invention relates to physical quantity sensors, in particular, relates to a physical quantity sensor having a sensor portion held in a casing and also relates to a method of making the physical quantity sensor.

BACKGROUND OF THE INVENTION

A physical quantity sensor generally includes a sensor portion formed with a substrate such as a semiconductor substrate or a ceramic substrate. The sensor portion is held in a casing made of resin, for example. The sensor portion detects a physical quantity such as acceleration based on a change in an electrical capacitance, a voltage, or the like. If a vibration of the casing is transmitted to the sensor portion, a noise contained in an output of the sensor portion increases. Therefore, there is a need to place a vibration isolation structure between the sensor portion and the casing to reduce a relative vibration between the sensor portion and the casing.

JP-A-2007-212174 discloses a sensor having a resin spring serving as a vibration isolation structure. The resin spring is located between a casing and a sensor portion and supports the sensor portion to the casing to reduce a relative vibration between the casing and the sensor portion. Since the sensor portion is small, the resin spring needs to have a small spring constant. However, it is difficult to form a resin spring having a small spring constant that is accurately adjusted to a derided value. Further, it is difficult to ensure structural strength of the resin spring.

SUMMARY OF THE INVENTION

In view of the above, it is an object of the present invention to provide a physical quantity sensor having a vibration isolation structure with a high strength and a spring constant that can be easily adjusted to a desired value. It is another object of the present invention to provide a method of making the physical quantity sensor.

According to a first aspect of the present invention, a physical quantity sensor includes a sensor portion having an end surface, a casing including a supporting portion having a supporting surface located to face the end surface of the sensor portion, and a vibration isolator located between the end surface and the supporting surface to join the sensor portion to the casing. The vibration isolator reduces a relative vibration between the sensor portion and the casing.

According to a second aspect of the present invention, a method of making a physical quantity sensor includes preparing a casing with an insert-molded lead frame, applying a liquid or semi-solid vibration isolator to a supporting surface of a supporting portion of the casing, inserting a jig in an opening of the supporting portion of the casing so that an end surface of the jig is exposed to the supporting surface through the opening, attaching a first side of a sensor portion on the supporting surface through the applied vibration isolator, while limiting movement of the sensor portion toward the supporting surface by the end surface of the jig, and connecting a bonding wire between a second side of the sensor portion opposite to the first side and the lead frame, while limiting the movement of the sensor portion by the end surface of the jig.

According to a third aspect of the present invention, a method of making a physical quantity sensor include preparing a casing that includes a casing body with an insert-molded lead frame and a temporally supporting member removably fixed to the casing body, applying a liquid or semi-solid vibration isolator to a supporting surface of a supporting portion of the casing body, attaching a first side of a sensor portion on the supporting surface through the applied vibration isolator, while limiting movement of the sensor portion toward the supporting surface by an end surface of the temporally supporting member, connecting a bonding wire between a second side of the sensor portion opposite to the first side and the lead frame, while limiting the movement of the sensor portion by the end surface of the temporally supporting member, and removing the temporally supporting member from the casing body.

According to a fourth aspect of the present invention, a physical quantity sensor includes a sensor portion, a casing, and a vibration isolator. The casing has an inner wall that defines an inner space for holding the sensor portion. The inner wall is spaced from the sensor portion to form a clearance therebetween. The vibration isolator is located in the clearance to join the sensor portion to the casing. The vibration isolator reduces a relative vibration between the sensor portion and the casing.

According to a fifth aspect of the present invention, a method of making a physical quantity sensor includes preparing a casing with an insert-molded lead frame. The casing has an opening extending from a top side of the casing to a bottom side of the casing. The method further includes attaching a temporally supporting tape to the top side of the casing to cover a top side of the opening, turning upside down the casing to which the temporally supporting tape is attached, placing a sensor portion in the turned casing such that the sensor portion is supported by the temporally supporting tape and such that an outer surface of the sensor portion is spaced from an inner surface of the casing to form a clearance therebetween, connecting a bonding wire between the supported sensor portion and the lead frame, placing a vibration isolator in the clearance between the sensor portion and the casing, turning upside down the casing in which the vibration isolator is placed, and removing the temporally supporting tape from the casing.

According to a sixth aspect of the present invention, a physical quantity sensor includes a sensor portion having an end surface, a casing including a supporting portion having a supporting surface located to face the end surface of the sensor portion, and a vibration isolation structure located between the sensor portion and the casing to reduce a relative vibration between the sensor portion and the casing. The vibration isolation structure includes first and second vibration isolators having different vibration damping properties.

According to a seventh aspect of the present invention, a method of making a physical quantity sensor includes preparing a casing with an insert-molded lead frame, applying a liquid or semi-solid first vibration isolator to a supporting surface of a supporting portion of the casing, attaching a sensor portion on the supporting surface through the applied first vibration isolator, injecting a liquid or semi-solid second vibration isolator between the sensor portion and the casing, and connecting a bonding wire between the sensor portion and the lead frame.

According to an eighth aspect of the present invention, a method of making a physical quantity sensor includes preparing a casing with an insert-molded lead frame, applying a liquid or semi-solid first vibration isolator to a supporting surface of a supporting portion of the casing, attaching a sensor portion on the supporting surface through the applied first vibration isolator, pressing a solid second vibration isolator having a predetermined shape in between the sensor portion and the casing, and connecting a bonding wire between the sensor portion and the lead frame after the solid second vibration isolator is pressed in.

According to a ninth aspect of the present invention, a method of making a physical quantity sensor includes preparing a casing with an insert-molded lead frame, applying a liquid or semi-solid vibration isolator to a supporting surface of a supporting portion of the casing, attaching a sensor portion on the supporting surface through the applied vibration isolator, pressing a metal spring having a predetermined shape in between the sensor portion and the casing, and connecting a bonding wire between the sensor portion and the lead frame after the metal spring is pressed in.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS (First Embodiment)

Figure 1A:
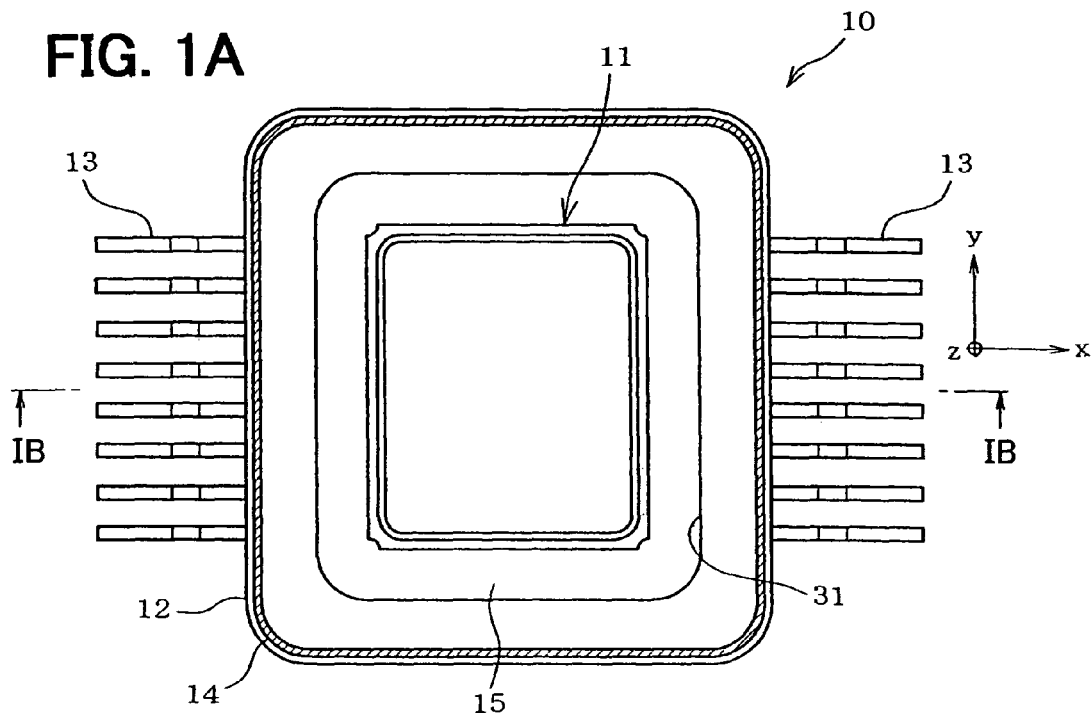
FIG. 1A is a diagram illustrating a plan view of a physical quantity sensor according to a first embodiment of the present invention.

A physical quantity sensor 10 according to a first embodiment of the present invention is described below with reference to FIGS. 1A and 1B. The physical quantity sensor 10 includes an inner unit 11 as a sensor portion, a casing 12, a lead frame 13, a cover 14, a vibration isolator 15, a bonding wire 16, and a cover 17. As shown in FIG. 2, the inner unit 11 includes a sensor chip 21, a signal processing chip 22, a package 23, and a lid 24.

Figure 3:
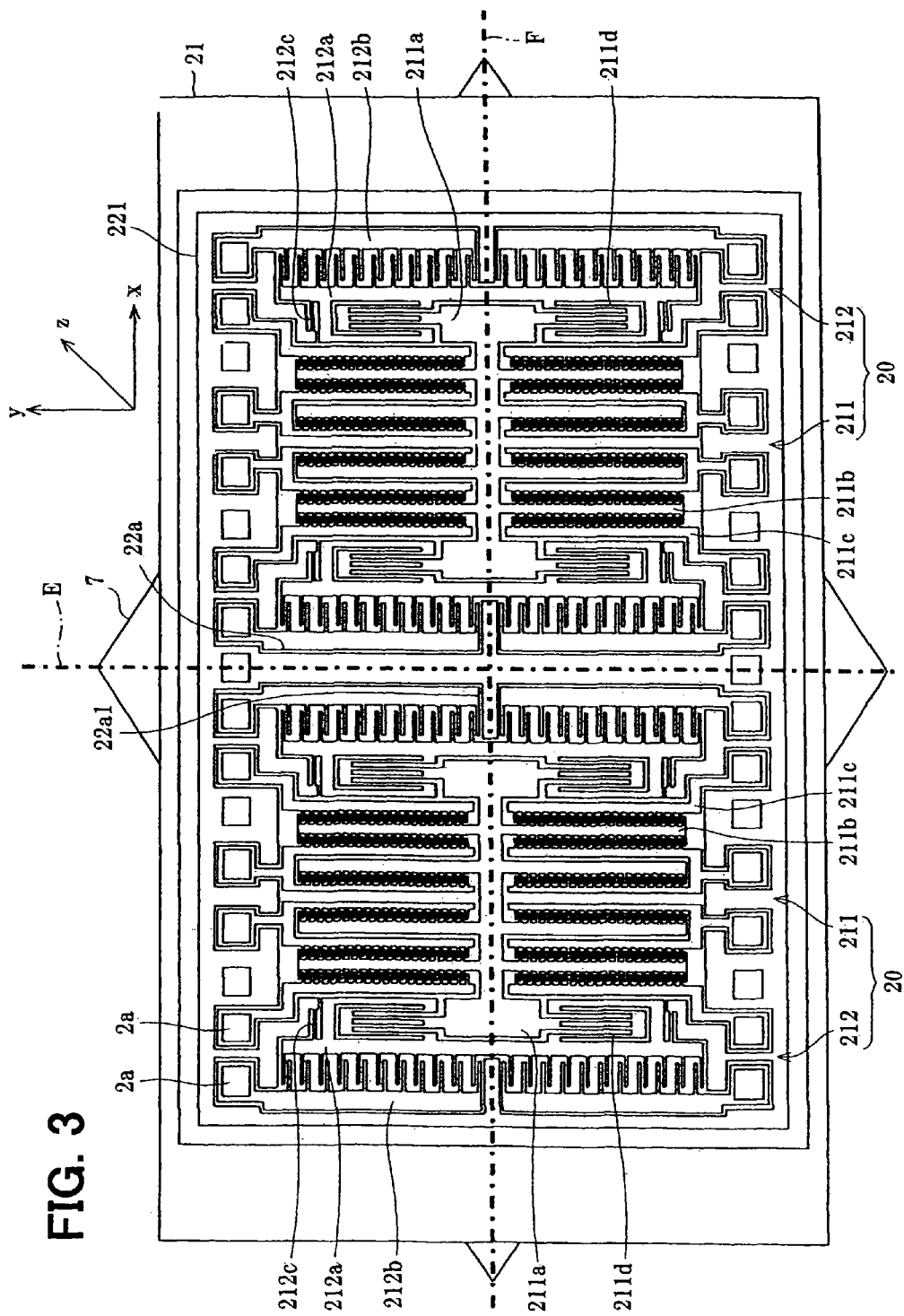
FIG. 3 is a diagram illustrating a plan view of a sensor chip of the physical quantity sensor of the first embodiment.

FIG. 3 is a diagram illustrating a schematic plan view of the sensor chip 21. For example, the sensor chip 21 has an area of twenty square millimeters (20 mm$^2$). The sensor chip 21 includes a pair of sensor elements 20. The sensor elements 20 are supported by a peripheral portion 221 in such a manner that the sensor elements 20 are symmetric with respect to a longitudinal center line E. The peripheral portion 221 has a rectangular flame shape and is held at a ground potential. Each sensor element 20 has the same structure and includes a driving portion 211 and a detecting portion 212.

The driving portion 211 is symmetric with respect to a lateral center line F. The driving portion 211 includes a weight portion 211a, a movable driving electrode 211b, and a fixed driving electrode 211c. The weight portion 211a is supported so that the weight portion 211a can be displaced relative to the peripheral portion 221. The movable driving electrode 211b has multiple comb-shaped electrodes and is integrally joined to the weight portion 211a. The fixed driving electrode 211c has multiple comb-shaped electrodes. The fixed driving electrode is located in parallel to the movable driving electrode 211b with a separation distance to drive the movable driving electrode at a predetermined frequency.

The detecting portion 212 is symmetric with respect to the lateral center line F. The detecting portion 212 includes a movable detecting electrode 212a and a fixed detecting electrode 212b. The movable detecting electrode 212a is supported so that the movable detecting electrode 212a can be displaced relative to the peripheral portion 221. The fixed detecting electrode 212b has multiple comb-shaped electrodes and is located in parallel to the movable detecting electrode 212a with a separation distance. The fixed detecting electrode 212b detects Coriolis force corresponding to an angular velocity acting on the sensor chip 21.

The movable driving electrode 211b can be displaced in a direction of a x-axis in FIG. 3, and the movable detecting electrode 212a can be displaced in a direction of a y-axis in FIG. 3. The y-axis is perpendicular to each of the x-axis and a z-axis. Specifically, a detecting beam 212c is integrally joined to the peripheral portion 221, the movable detecting electrode 212a is integrally joined to the detecting beam 212c, a driving beam 211d is integrally joined to the movable detecting electrode 212a, and the weight portion 211a is integrally joined to the driving beam 211d.

The peripheral portion 221 has a cross-shaped reinforcement 22a that is located between the sensor elements 20. A cross-point of the reinforcement 22a coincides with the center of the sensor chip 21. The reinforcement 22a has a x-axis portion 22a1 extending in the x-axis direction. The x-axis portion 22a1 is located in the middle of the fixed detecting electrode 212b. A bonding pad 2a is formed on the peripheral portion 221 and each electrode.

An angular velocity detecting operation of the sensor chip 21 is described below.

Firstly, a periodic voltage signal is applied between the fixed driving electrode 211c and the movable driving electrode 211b to cause the weight portion 211a to vibrate in the x-axis direction. If an angular velocity around the z-axis direction is applied to the sensor chip 21 during a period of time when the weight portion 211a vibrates in the x-axis direction, Coriolis force acts on the weight portion 211a so that the weight portion 211a can be displaced in the y-axis direction. As a result, the detecting beam 212c is deformed in the y-axis direction, and the weight portion 211a, the movable driving electrode 211b, and the movable detecting electrode 212a are displaced in the y-axis direction.

The displacement of the weight portion 211a in the y-axis direction is transmitted to the movable detecting electrode 212a through the driving beam 211d. Since a predetermined voltage is applied between the movable detecting electrode 212a and the fixed detecting electrode 212b at this time, a capacitance between the movable detecting electrode 212a and the fixed detecting electrode 212b changes with the displacement of the movable detecting electrode 212a. A change in the capacitance is measured by a capacitance-to-voltage converter included in the signal processing chip 22, and the angular velocity acting on the sensor chip 21 is detected based on the measured capacitance change.

Each of the movable detecting electrode 212a and the fixed detecting electrode 212b is placed in parallel to at least one side of the sensor chip 21 in a planar direction of the sensor chip 21. That is, the change on the capacitance between the movable detecting electrode 212a and the fixed detecting electrode 212b is caused by the displacement of the movable detecting electrode 212a in a direction of the side of the sensor chip 21.

To reduce the effect of external vibration noise, it is preferable to cause the weight portions 211a of the sensor elements 20 to vibrate in oppose directions in the x-axis direction. For example, one sensor element 20 is configured to be displaced in a plus direction of the x-axis, and the other sensor element 20 is configured to be displaced in a minus direction of the x-axis. In such an approach, when the angular velocity acts on the sensor chip 21, one sensor element 20 is displaced in a plus direction of the y-axis, and the other sensor element 20 is displaced in a minus direction of the y-axis.

The sensor element 20 shown in FIG. 3 has a so-called "external-detect and internal-drive" structure, in which the detecting portion 212 is joined to and supported by the peripheral portion 221, and the driving portion 211 is supported by the peripheral portion 221 through the detecting portion 212. Alternatively, the sensor element 20 can have a so-called "external-drive and internal-detect" structure, in which the driving portion 211 is joined to and supported by the peripheral portion 221, and the detecting portion 212 is supported by the peripheral portion 221 through the driving portion 211.

The signal processing chip 22 performs signal processing on the capacitance or voltage change detected by the sensor chip 21 and adjusts a voltage applied to the sensor chip 21. The sensor chip 21 and the signal processing chip 22 are formed on a common substrate such as a silicon substrate or a ceramic substrate. Alternatively, the sensor chip 21 and the signal processing chip 22 can be formed on different substrates, respectively. The sensor chip 21 shown in FIG. 3 is configured to detect an angular velocity. Alternatively, the sensor ship 21 can be configured to detect a physical quantity other than an angular velocity. For example, the sensor chip 21 can be configured to detect an acceleration in the x-axis direction or in the y-axis direction. The configuration of the signal processing chip 22 can vary according to a physical quantity detected by the sensor chip 21.

The sensor chip 21 and the signal processing chip 22 are electrically connected together through a bonding wire 25. The package 23 has an inner space and an entrance leading to the inner space. The sensor chip 21 and the signal processing chip 22 are held in the inner space of the package 23. The package 23 is made of ceramics, resin, or the like. The lid 24 is attached to the package 23 to cover the entrance so that the inner space can be sealed. The signal processing chip 22 is fixed to the package 23 through an adhesive (not shown) or the like. To reduce thermal stress applied to the signal processing chip 22, it is preferable that the adhesive be soft and have a small elastic modulus. The sensor chip 21 is fixed to the signal processing chip 22 through an adhesive sheet 26. The adhesive sheet 26 can be the same type as the adhesive through which the signal processing chip 22 is fixed to the package 23. Alternatively, the adhesive sheet 26 can be a different type than the adhesive. In this way, the signal processing chip 22 is mounted on the package 23, and the sensor chip 21 is mounted on the package 23 through the signal processing chip 22.

Figure 1B:
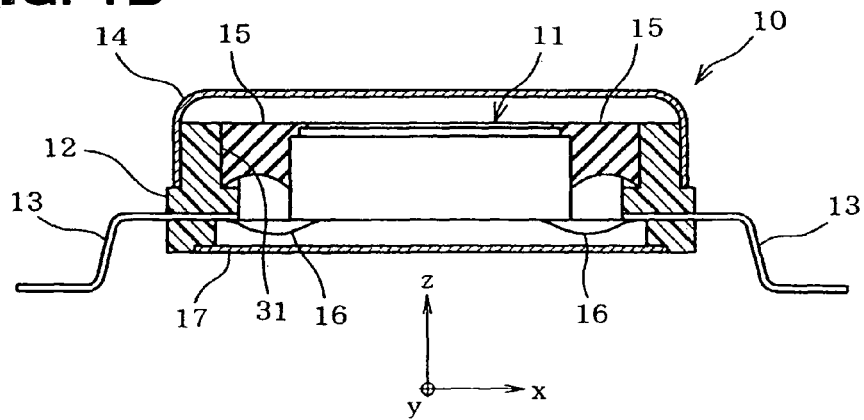
FIG. 1B is a diagram illustrating a cross-sectional view taken along line IB-IB in FIG. 1A.
Figure 2:
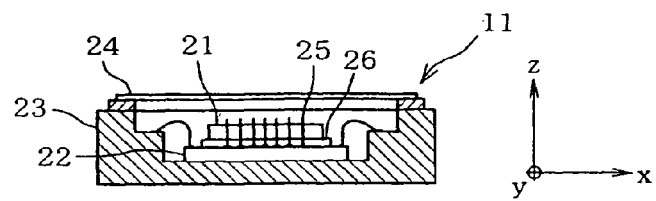
FIG. 2 is a diagram illustrating a cross-sectional view of an inner unit of the physical quantity sensor of the first embodiment.

As shown in FIG. 1B, the inner unit 11 is held in the casing 12. The casing 12 is made of resin. The casing 12 has a rectangular tube shape with an opening 31 extending from a top side to a bottom side of the casing 12. The opening 31 is larger than the inner unit 11 so that the inner unit 11 can be held in the opening 31. The lead frame 13 is insert-molded with the casing 12. The inner unit 11 and the lead frame 13 are electrically connected together through the bonding wire 16. The cover 14 covers a sensor side of the inner unit 11. The cover 17 covers a package side of the inner unit 11. The sensor side of the inner unit 11 is a side where the sensor chip 21 is located, and the package side of the inner unit 11 is a side where the package 23 is located. That is, the sensor side of the inner unit 11 is a top side in FIG. 2, and the package side of the inner unit 11 is a bottom side in FIG. 2. Since the opening 31 of the casing 12 is larger than the inner unit 11, there is a clearance between the inner unit 11 and the casing 12. The vibration isolator 15 is located between the inner unit 11 and the casing 12 to fill the clearance. For example, the vibration isolator 15 can be made of soft elastomer such as silicone rubber, room temperature vulcanization (RTV) silicone rubber, or the like.

Figure 4A:
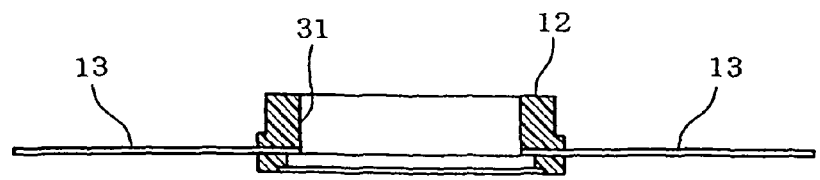
FIGS. 4A-4F are diagrams illustrating a method of making the physical quantity sensor of the first embodiment.
Figure 4B:
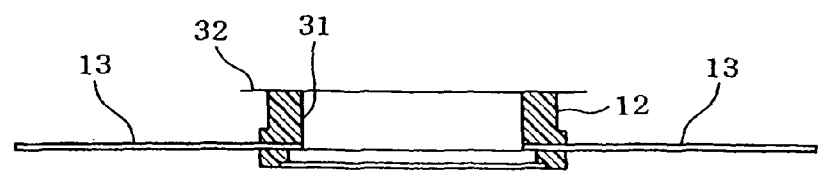
Figure 4C:
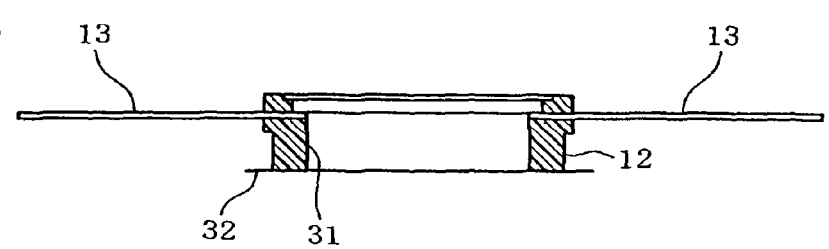
Figure 4D:
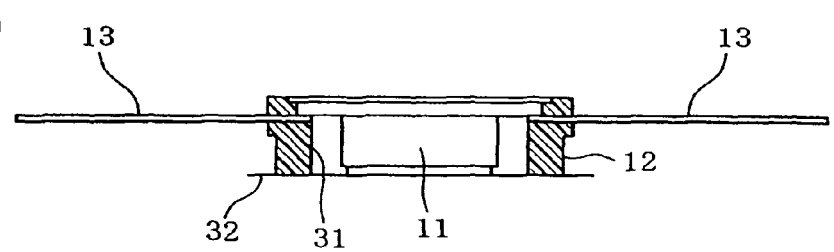

An example of a method of making the physical quantity sensor 10 of the first embodiment is described below with reference to FIGS. 4A-4F and 5A-5E. Firstly, as shown in FIG. 4A, the lead frame 13 is insert-molded with the casing 12 so that the casing 12 and the lead frame 13 can be integrally joined together. Then, as shown in FIG. 4B, a temporally supporting tape 32 is attached to the top side of the casing 12. Then, as shown in FIG. 4C, the casing 12 is turned upside down so that the temporally supporting tape 32 can be located on the bottom side of the casing 12. Then, as shown in FIG. 4D, the inner unit 11 is placed in the casing 12 by attaching the sensor side (i.e., lid 24) of the inner unit 11 to the temporally supporting tape 32. Thus, the inner unit 11 is supported by the temporally supporting tape 32.

Figure 4E:
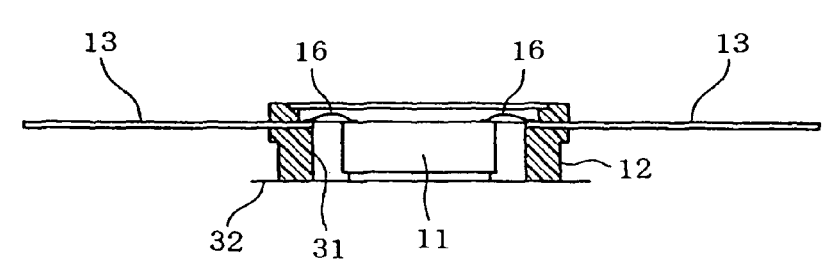
Figure 4F:
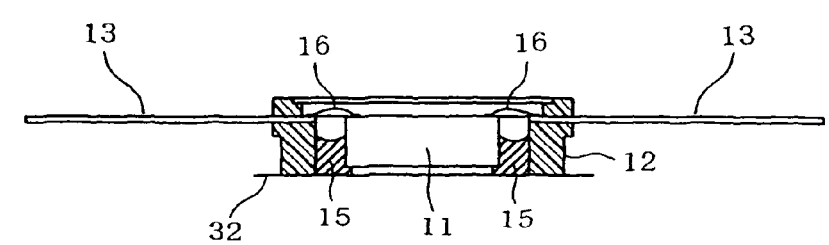

Then, as shown in FIG. 4E, the inner unit 11 and the lead frame 13 are electrically connected together through the bonding wire 16. Then, as shown in FIG. 4F, elastomer is injected in the clearance between the inner unit 11 and the casing 12 to form the vibration isolator 15. The inner unit 11 and the lead frame 13 are connected together through the bonding wire 16 at one pair of opposing sides of the inner unit 11, which has a rectangular shape. That is, the bonding wire 16 is not located at the other pair of opposing sides of the inner unit 11. Therefore, the elastomer is injected from the other pair of opposing sides of the inner unit 11. In such an approach, the elastomer can be easily injected in the clearance without interfering with the bonding wire 16. Further, it is less likely that the bonding wire 16 is damaged due to a manufacturing step for injecting the elastomer.

Figure 5A:
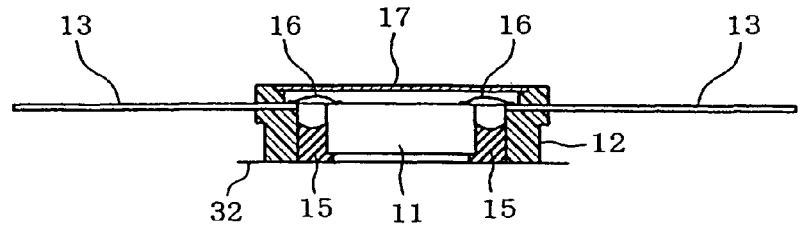
FIGS. 5A-5E are diagrams illustrating the method of making the physical quantity sensor of the first embodiment.
Figure 5B:
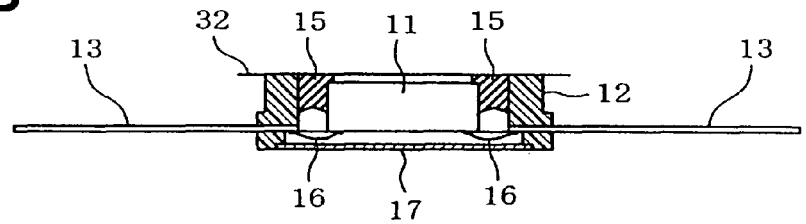
Figure 5C:
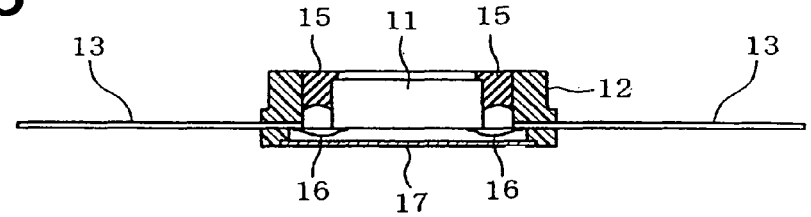

After the injected elastomer cures (i.e., hardens) to form the vibration isolator 15, the cover 17 is attached to the casing 12. Specifically, as shown in FIG. 5A, the cover 17 is attached to the casing 12 to cover the package side of the inner unit 11. For example, the cover 17 is press-fitted to the casing 12. Then, as shown in FIG. 5B, the casing 12 is turned upside down so that the temporally supporting tape 32 can be located on the top side of the casing 12. Then, as shown in FIG. 5C, the temporally supporting tape 32 is removed. Since the vibration isolator 15 supports the inner unit 11 to the casing 12, the inner unit 11 does not fall off the casing 12 after the removal of the temporally supporting tape 32.

Figure 5D:
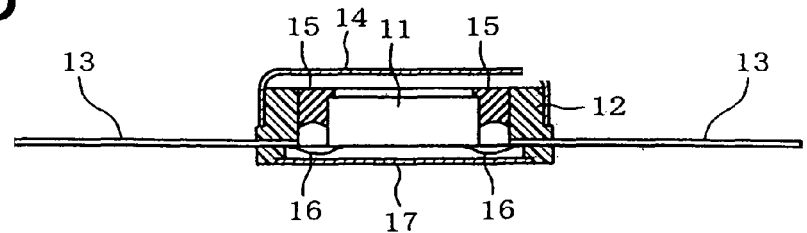
Figure 5E:
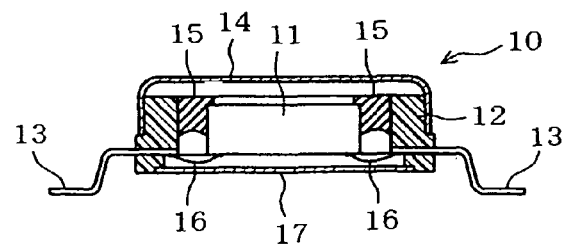

After the temporally supporting tape 32 is removed, the cover 14 is attached to the casing 12. Specifically, as shown in FIG. 5D, the cover 14 is attached to cover the sensor side of the inner unit 11. For example, the cover 14 is press-fitted to the casing 12. Finally, as shown in FIG. 5E, the lead frame 13 is formed in a predetermined shape, and an unnecessary portion of the lead frame 13 is removed. In this way, the physical quantity sensor 10 is completed. In the completed physical quantity sensor 10, it is preferable that the cover 14 be spaced from the lid 24 of the inner unit 11.

In the first embodiment, the vibration isolator 15 is located between the inner unit 11 and the casing 12. A resonance frequency of the inner unit 11 is an important factor to determine vibration isolation characteristics in the physical quantity sensor 10. The resonance frequency of the inner unit 11 is defined by the mass of the inner unit 11 and a spring constant of the vibration isolator 15. The spring constant of the vibration isolator 15 depends on the clearance between the inner unit 11 and the casing 12 or depends on the thickness of the vibration isolator 15. A vibration damping property of the vibration isolator 15 is adjusted to a desired value by changing the spring constant of the vibration isolator 15. For example, when the physical quantity sensor 10 is a gyroscope having an oscillator vibrating with a predetermined driving frequency, a vibration of the driving frequency needs to be damped in order to reduce (i.e., damp) a relative vibration between the inner unit 11 and the casing 12. For example, the driving frequency is about ten kilohertz (10 kHz). To reduce a vibration of about 10 kHz, the vibration isolator 15 needs to have a resonance frequency of about one kilohertz (1 kHz). In the case, it is preferable that the vibration isolator 15 have a small resonance magnification. Since the vibration isolator 15 is made of elastomer having viscosity and elasticity, the vibration isolator 15 can have a high loss coefficient. Therefore, the vibration isolator 15 can have a small resonance magnification.

As described above, according to the first embodiment, the vibration isolator 15 is located between the inner unit 11 and the casing 12 to support the inner unit 11 to the casing 12. In such an approach, a vibration transmitted from the casing 12 to the inner unit 11 can be reduced. Further, since the vibration isolator 15 is soft, the vibration isolator 15 absorbs a relative vibration between the inner unit 11 and the casing 12 while joining the inner unit 11 to the casing 12.

The vibration isolator 15 is located between the inner unit 11 and the casing 12 in the x-axis and y-axis directions so that x-axis and y-axis components of the vibration transmitted from the casing 12 to the inner unit 11 can be effectively reduced. Therefore, it is less likely that the sensor element 20 configured to move in the x-axis and y-axis directions is affected by the vibration.

The strength and the spring constant of the vibration isolator 15 can be easily adjusted by changing the thickness and the width of the vibration isolator 15. Therefore, the spring constant of the vibration isolator 15 can be adjusted to a desired value that allows the vibration isolator 15 to reduce the relative vibration between the inner unit 11 and the casing 12 without a reduction in the strength.

The covers 14, 17 are spaced from the inner unit 11. That is, the covers 14, 17 are not directly in contact with the inner unit 11. Therefore, vibrations of the covers 14, 17 are not directly transmitted to the inner unit 11. Since the vibrations of the covers 14, 17 are transmitted through the vibration isolator 15 to the inner unit 11, the inner unit 11 can be effectively protected from the vibrations.

As shown in FIG. 1, all sides of the inner unit 11 in the x-axis and y-axis directions are surrounded by the vibration isolator 15. That is, the inner unit 11 is entirely surrounded by the vibration isolator 15 in the x-axis and y-axis directions. In such an approach, even when thermal stress is applied from the vibration isolator 15 to the inner unit 11, the thermal stress is equally applied to all sides of the inner unit 11. Therefore, the inner unit 11 can maintain its attitude with respect to the z-axis direction. For example, when the physical quantity sensor 10 is configured to be an angular velocity sensor or an acceleration sensor, the z-axis is a detection axis. If the inner unit 11 is inclined with respect to the detection axis, the physical quantity sensor 10 cannot accurately detect angular velocity or acceleration. In view of the above, it is preferable that all sides of the inner unit 11 in the x-axis and y-axis directions be surrounded by the vibration isolator 15, when the physical quantity sensor 10 is configured to be an angular velocity sensor or an acceleration sensor. Alternatively, all sides of the inner unit 11 in the x-axis and y-axis directions may not be surrounded by the vibration isolator 15. That is, the inner unit 11 can be partially surrounded by the vibration isolator 15 in the x-axis and y-axis directions.

Further, as shown in FIG. 1B, the vibration isolator 15 does not reach the bottom side of the package 23 where the inner unit 11 and the lead frame 13 are electrically connected together through the bonding wire 16. That is, the package side of the inner unit 11 is not covered with the vibration isolator 15. Since the package side of the inner unit 11 is not covered with the vibration isolator 15, the following advantages can be achieved.

A deformation of the sensor chip 21 causes a change in distance between the movable driving electrode 211b and the fixed driving electrode 211c and a change in distance between the movable detecting electrode 212a and the fixed detecting electrode 212b. These distance changes cause a reduction in detection accuracy of the physical quantity sensor 10. In the structure shown in FIG. 1B, thermal stress is applied from the vibration isolator 15 to an upper portion of an outer wall of the package 23. Accordingly, the upper portion of the outer wall of the package 23 is deformed. The deformation of the upper portion of the outer wall of the package 23 is transmitted to a bottom of the package 23. Accordingly, the bottom of the package 23 is deformed. The deformation of the bottom of the package 23 is transmitted to the signal processing chip 22.

Accordingly, the signal processing chip 22 is deformed. The deformation of the signal processing chip 22 is transmitted to the adhesive sheet 26. Accordingly, the adhesive sheet 26 is deformed. The deformation of the adhesive sheet 26 is transmitted to the sensor chip 21. In this way, according to the structure shown in FIG. 1B, the thermal stress of the vibration isolator 15 is indirectly transmitted to the sensor chip 21. Therefore, the structure shown in FIG. 1B reduces the thermal stress applied from the vibration isolator 15 to the sensor chip 21 so that the deformation of the sensor chip 21 can be reduced. In contrast, if the package side of the inner unit 11 is covered with the vibration isolator 15, the thermal stress of the vibration isolator 15, is directly transmitted to the sensor chip 21. As a result, the sensor chip 21 is greatly deformed.

(Second Embodiment)

A physical quantity sensor 10 according to a second embodiment of the present invention is described below with reference to FIG. 6. A difference between the first and second embodiments is as follows.

Figure 6:
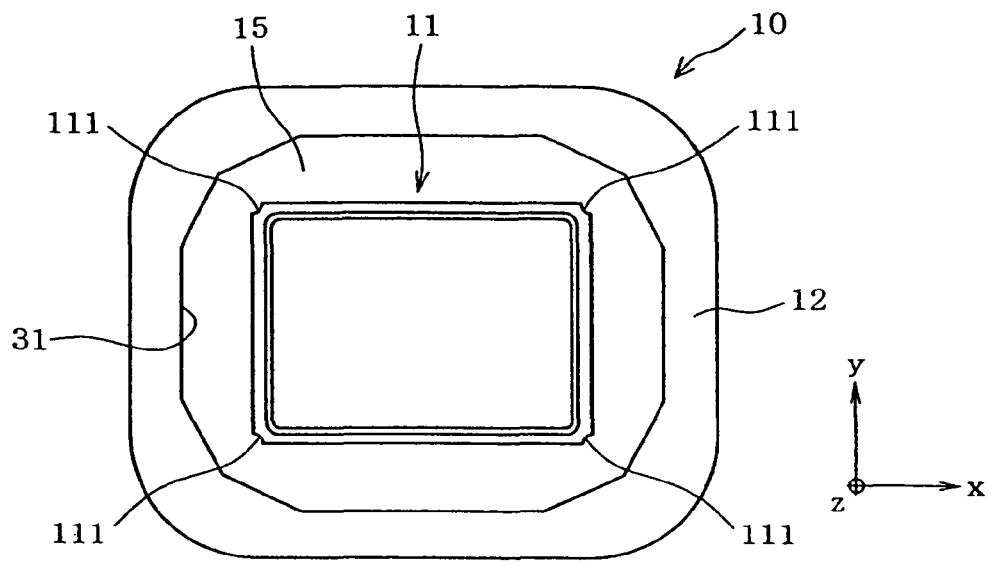
FIG. 6 is a diagram illustrating a plan view of a physical quantity sensor according to a second embodiment of the present invention.

In the second embodiment, as shown in FIG. 6, an opening 31 of the casing 12 has a polygonal shape that allows a clearance (i.e., distance) between the inner unit 11 and the casing 12 to be smaller at a corner 111 of the inner unit 11 than at a side of the inner unit 11. Alternatively, the opening 31 of the casing 12 can have other shape (e.g., circle or ellipse) that allows the clearance between the inner unit 11 and the casing 12 to be smaller at the corner 111 of the inner unit 11 than at the side of the inner unit 11.

A vibration isolator 15 is formed by injecting elastomer in the clearance between the inner unit 11 and the casing 12. Therefore, the width of the vibration isolator 15 changes along the periphery of the inner unit 11. As the width of the vibration isolator 15 becomes greater, the vibration isolator 15 becomes harder. In other words, as the clearance between the inner unit 11 and the casing 12 becomes greater, the vibration isolator 15 becomes harder. Therefore, the vibration isolator 15 has a greater hardness at a corner portion corresponding to the corner 111 of the inner unit 11 than at a side portion corresponding to the side of the inner unit 11.

During use of the physical quantity sensor 10, the inner unit 11 supported to the casing 12 may receive vibration force that causes the inner unit 11 to vibrate in the x-axis and y-axis directions of FIG. 6. Further, the inner unit 11 may receive rotation force that causes the inner unit 11 to rotate around a center axis of the inner unit 11 in the z-axis direction of FIG. 6. That is, the inner unit 11 may receive rotation force that causes the inner unit 11 to rotate with respect to the casing 12. The rotation force is absorbed by a difference in hardness between the corner portion and the side portion of the vibration isolator 15. Specifically, since the corner portion of the vibration isolator 15 has a greater hardness, the inner unit 11 is securely supported to the casing 12 at the corner 111 through the corner portion of the vibration isolator 15. Accordingly, the rotation movement of the inner unit 11 with respect to the casing 12 can be reduced.

As described above, according to the second embodiment, the width of the vibration isolator 15 changes along the periphery of the inner unit 11. Specifically, the width of the corner portion of the vibration isolator 15 is smaller than the width of the side portion of the vibration isolator 15. In such an approach, the inner unit 11 is securely supported to the casing 12 at the corner 111 through the corner portion of the vibration isolator 15 so that the rotation movement of the inner unit 11 with respect to the casing 12 can be reduced.

Further, as shown in FIG. 6, the corner 111 of the inner unit 11 is recessed. In such an approach, the inner unit 11 is more securely supported to the casing 12 at the corner 111 through the corner portion of the vibration isolator 15. Alternatively, the corner 111 of the inner unit 11 can be rounded or sharpened.

Figure 7A:
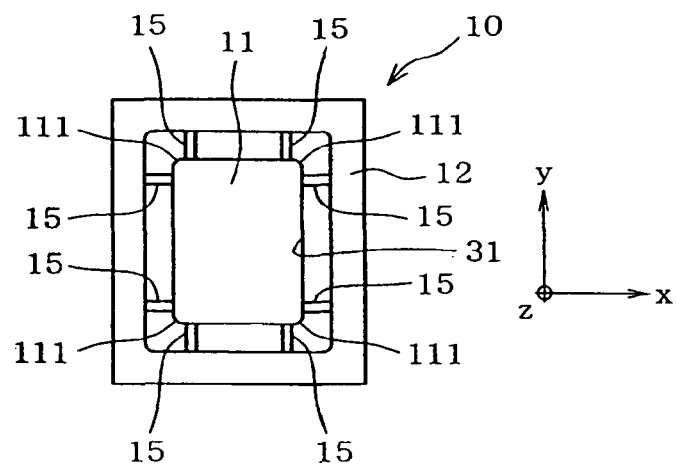
FIG. 7A is a diagram illustrating a plan view of a physical quantity sensor according to a modification of the second embodiment.
Figure 7B:
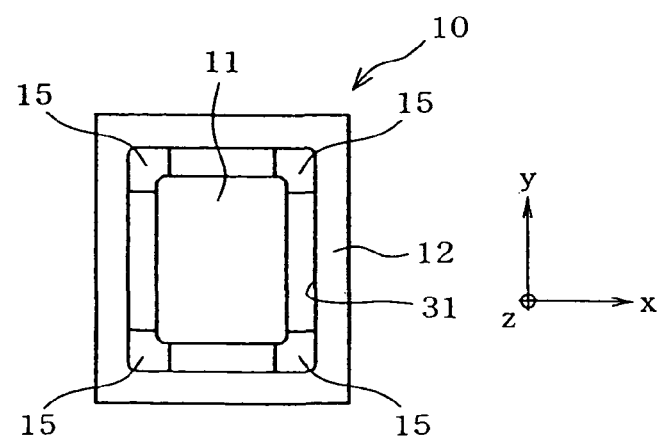
FIG. 7B is a diagram illustrating a plan view of a physical quantity sensor according to another modification of the second embodiment.

Modifications of the second embodiment are described below with reference to FIGS. 7A and 7B. In one modification shown in FIG. 7A, the vibration isolator 15 has both corner portions and side portions. The corner portions of the vibration isolator 15 are located between the inner unit 11 and the casing 12 at corners 111 of the inner unit 11. The side portions of the vibration isolator 15 are located between the inner unit 11 and the casing 12 at sides of the inner unit 11. The corner and side portions of the vibration isolator 15 are arranged spaced from each other along the periphery of the inner unit 11. In another modification; the vibration isolator 15 has only corner portions located between the inner unit 11 and the casing 12 at corners 111 of the inner unit 11. As described in the second embodiment, the rotational movement of the inner unit 11 with respect to the casing 12 can be reduced by the corner portions of the vibration isolator 15. Therefore, the rotational movement of the inner unit 11 with respect to the casing 12 can be reduced, even when the vibration isolator 15 has only corner portions.

As described above, according to the modifications of the second embodiment, the inner unit 11 is partially surrounded by the vibration isolator 15 in such a manner that the vibration isolator 15 is located between the inner unit 11 and the casing 12 at least at the corners 111 of the inner unit 11. In such an approach, the rotational movement of the inner unit 11 with respect to the casing 12 can be reduced.

(Third Embodiment)

A third embodiment of the present invention is described below with reference to FIGS. 8A-8C.

Figure 8A:
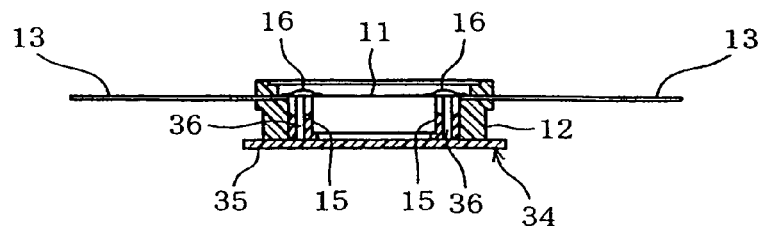
FIG. 8A is a diagram illustrating a cross-sectional view of a physical quantity sensor according to a third embodiment of the present invention made by using a jig.
Figure 8B:
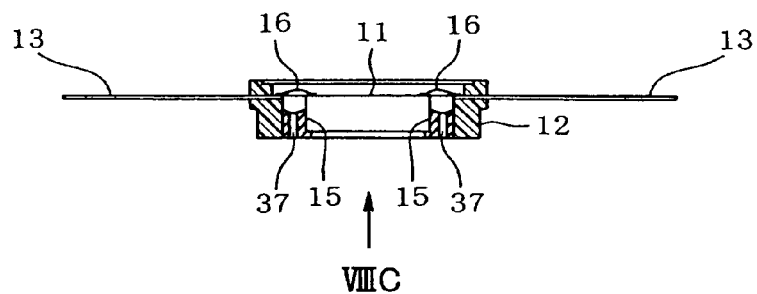
FIG. 8B is a diagram illustrating a cross sectional view of the physical quantity sensor of FIG. 8A from which the jig is removed.

In the third embodiment, as shown in FIG. 8A, a temporally supporting jig 34 is used instead of the temporally supporting tape 32, when the physical quantity sensor 10 is made. The temporally supporting jig 34 includes a sheet portion 35 and multiple projection portions 36 standing on the sheet portion 35. The projection portions 36 are arranged to follow the clearance between the inner unit 11 and the casing 12. Specifically, as shown in FIG. 8A corresponding to FIG. 4F, when the temporally supporting jig 34 is attached to the casing 12, the projection portions 36 are located substantially in the center of the clearance between the inner unit 11 and the casing 12 and surrounds the periphery of the inner unit 11. After the temporally supporting jig 34 is attached to the casing 12, elastomer for the vibration isolator 15 is injected in the clearance, where the projection portions 36 are located. As a result, the clearance is filled with the elastomer, and the projection portions 36 are encapsulated in the elastomer. Then, when the injected elastomer cures to form the vibration isolator 15, the temporally supporting jig 34 is removed from the vibration isolator 15. It is preferable that a surface of each projection portion 36 be coated with fluorine resin or the like. In such an approach, the temporally supporting jig 34 can be easily removed from the vibration isolator 15. As shown in FIG. 8B, the vibration isolator 15 formed by using the temporally supporting jig 34 has multiple through holes 37 extending therethrough. As shown in FIG. 8C, the through holes 37 of the vibration isolator 15 are arranged to surround the periphery of the inner unit 11.

As described above, according to the third embodiment, the vibration isolator 15 has the through holes 37. The spring constant of the vibration isolator 15 depends on the number and arrangement of the through holes 37. Therefore, the spring constant of the vibration isolator 15 can be adjusted by changing the number and arrangement of the projection portions 36 of the temporally supporting jig 34. In this way, the spring constant of the vibration isolator 15 can be easily adjusted to a desired value.

Figure 8C:
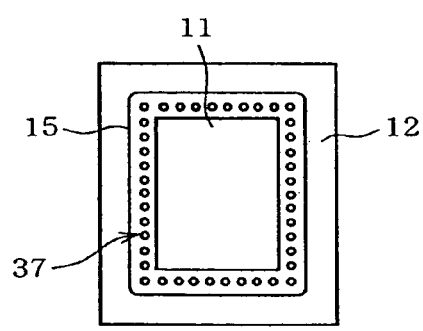
FIG. 8C is a diagram viewed from a direction indicated by an arrow VIIIC in FIG. 8B.

In FIG. 8C, the through hole 37 is located in the corner portion of the vibration isolator 15. Alternatively, no through hole 37 can be located in the corner portion of the vibration isolator 15. In such an approach, the vibration isolator 15 has a greater hardness at the corner portion than at the side portion. Thus, like the second embodiment, the rotational movement of the inner unit 11 with respect to the casing 12 can be reduced.

(Fourth Embodiment)

Figure 9:
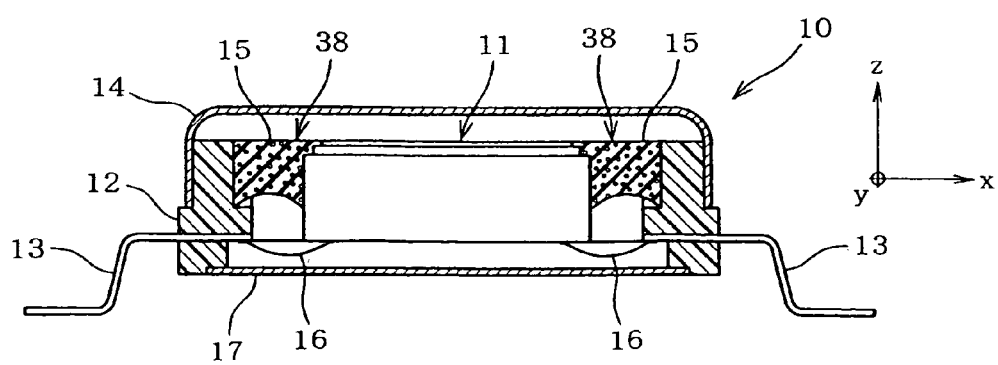
FIG. 9 is a diagram illustrating a cross-sectional view of a physical quantity sensor according to a fourth embodiment of the present invention.

A physical quantity sensor 10 according to a fourth embodiment of the present invention is described below with reference to FIG. 9. In the fourth embodiment, as shown in FIG. 9, the vibration isolator 15 has bubbles 38. That is, the vibration isolator 15 is made of a porous foam material such as sponge. The spring constant of the vibration isolator 15 depends on a percentage of the bubbles 38 contained in the vibration isolator 15. Therefore, the spring constant of the vibration isolator 19 can be easily adjusted to a desired value by changing the percentage of the bubbles 38 contained in the vibration isolator 15.

(Fifth Embodiment)

Figure 10A:
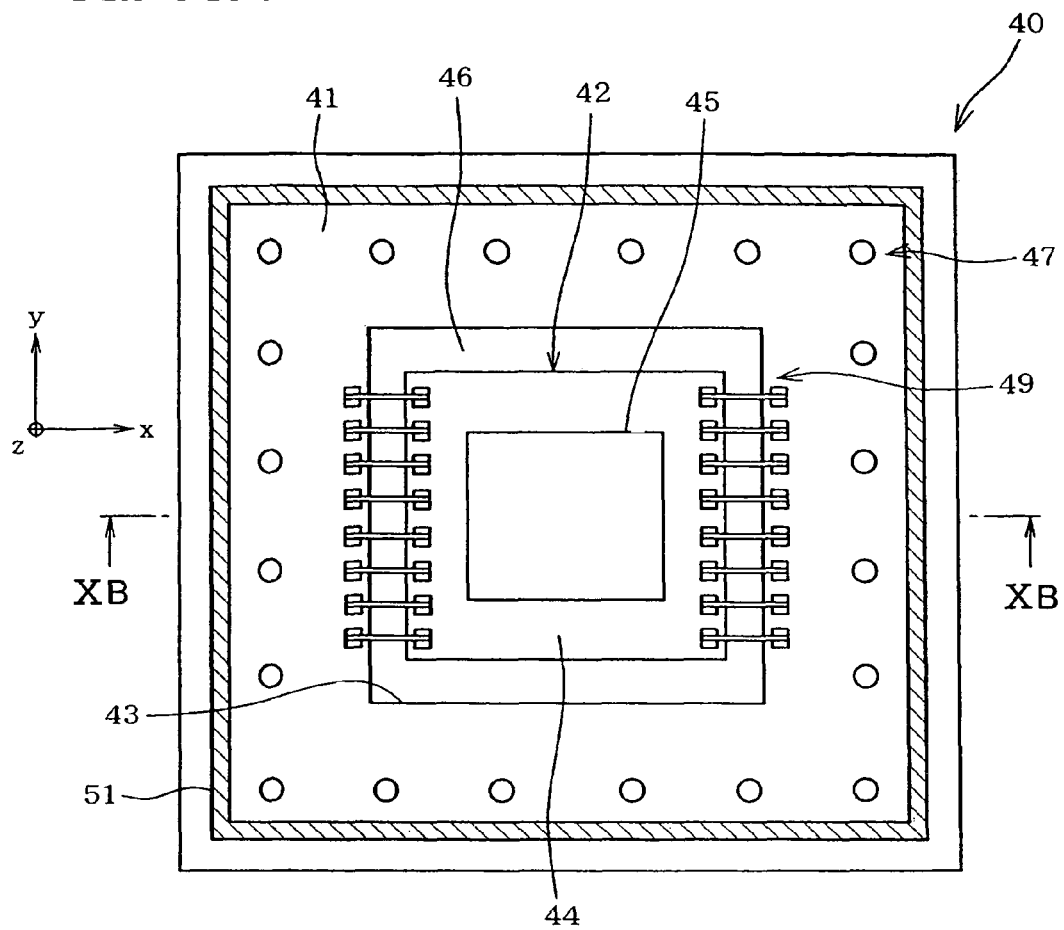
FIG. 10A is a diagram illustrating a plan view of a physical quantity sensor according to a fifth embodiment of the present invention.
Figure 10B:
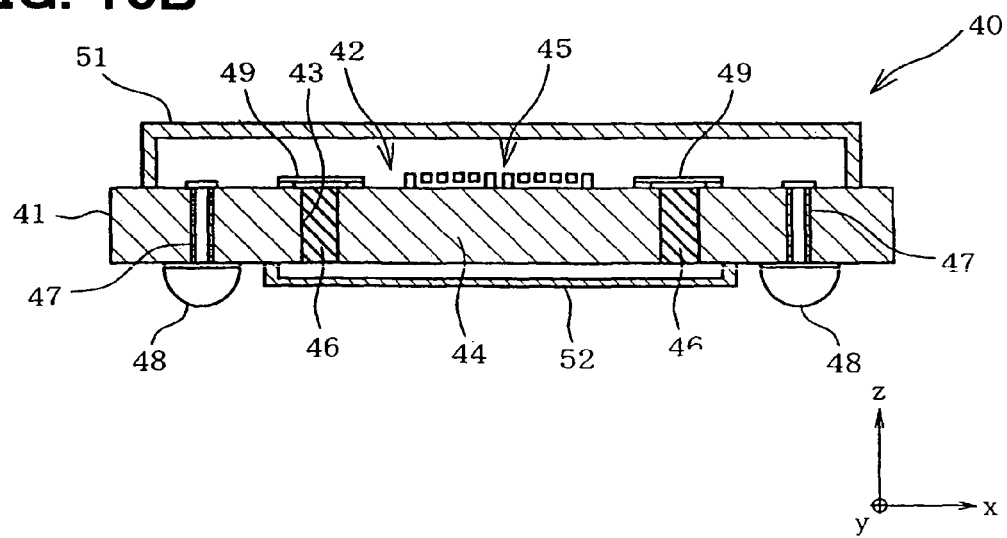
FIG. 10B is a diagram illustrating a cross-sectional view taken along line XB-XB in FIG. 10A.

A physical quantity sensor 40 according to a fourth embodiment of the present invention is described below with respect to FIGS. 10A and 10B. A difference between the fifth embodiment and the preceding embodiments is as follows. In the preceding embodiments, the inner unit 11 having the sensor chip 21 held in the package 23 is used as a sensor portion, and the sensor portion is held in the casing 12. In contrast, in the fifth embodiment, a wafer level package is used.

For example, the physical quantity sensor 40 can be made by microelectromechanical systems (MEMS). The physical quantity sensor 40 includes a rectangular tube-shaped frame portion 41 (as a casing) and a sensor portion 42. The frame portion 41 has an opening 43 inside and is made of silicon. The sensor portion 42 is held in the opening 43 of the frame portion 41. The sensor portion 42 has a substrate 44 made of silicon and a sensor element 45. The substrate 44 has first and second sides (top and bottom sides of FIG. 10B) opposite to each other. The sensor element 45 is formed on the first side of the substrate 44. There is a clearance between the frame portion 41 and the sensor portion 42. A vibration isolator 46 is located in the clearance. The vibration isolator 46 is formed as one piece and has a continuous ring shape. The vibration isolator 46 fills the clearance and surrounds the sensor portion 42.

The frame portion 41 has an electrode 47 that penetrates through the frame portion 41 in a thickness direction of the frame portion 41. Thus, the electrode 47 has a first end exposed to a first side (top side in FIG. 10B) of the frame portion 41 and a second end exposed to a second side (bottom side in FIG. 10B), opposite to the first side, of the frame portion 41. The second end of the electrode 47 is electrically connected to a bump 48. The bump 48 is located on the second side of the frame portion 41. That is, the bump 48 and the sensor element 45 are located on opposite sides. The first end of the electrode 47 is electrically connected to the sensor portion 42 through a bonding wire 49. The bonding wire 49 straddles the vibration isolator 46. The first side of the sensor portion 42 is covered with a cover 51 to cover the sensor element 45. The second side of the sensor portion 42 is covered with a cover 52.

As described above, according to the fifth embodiment, the vibration isolator 46 is located between the frame portion 41 and the sensor portion 42. Thus, the vibration isolator 46 reduces a vibration transmitted to the sensor portion 42 from the frame portion 41. In this way, when the physical quantity sensor 40 is made by MEMS, a relative vibration between the frame portion 41 and the sensor portion 42 can be reduced.

(Sixth Embodiment)

A physical quantity sensor 60 according to a sixth embodiment of the present invention is described below with reference to FIG. 11.

Figure 11:
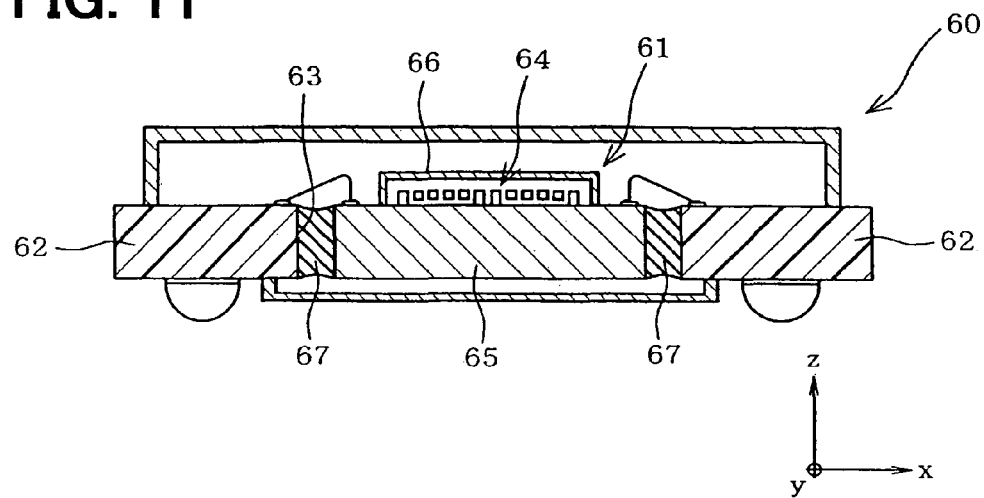
FIG. 11 is a diagram illustrating a cross-sectional view of a physical quantity sensor according to a sixth embodiment of the present invention.

As shown in FIG. 11, the physical quantity sensor 60 includes a sensor portion 61 and an organic substrate 62 (as a casing). The sensor portion 61 is held in an opening 63 of the organic substrate 62. The sensor portion 61 includes a sensor chip 65 having a sensor element 64. The sensor element 64 of the sensor chip 65 is covered with a cover 66. The organic substrate 62 is made of an electrical insulating organic material such as epoxy resin. A vibration isolator 67 is located between the sensor portion 61 and the organic substrate 62. Thus, the vibration isolator 67 reduces a vibration transmitted to the sensor portion 61 from the organic substrate 62 so that a relative vibration between the sensor portion 61 and the organic substrate 62 can be reduced.

(Seventh Embodiment)

A physical quantity sensor 60 according to a seventh embodiment of the present invention is described below with reference to FIG. 12. The seventh embodiment is a modification of the sixth embodiment.

Figure 12:
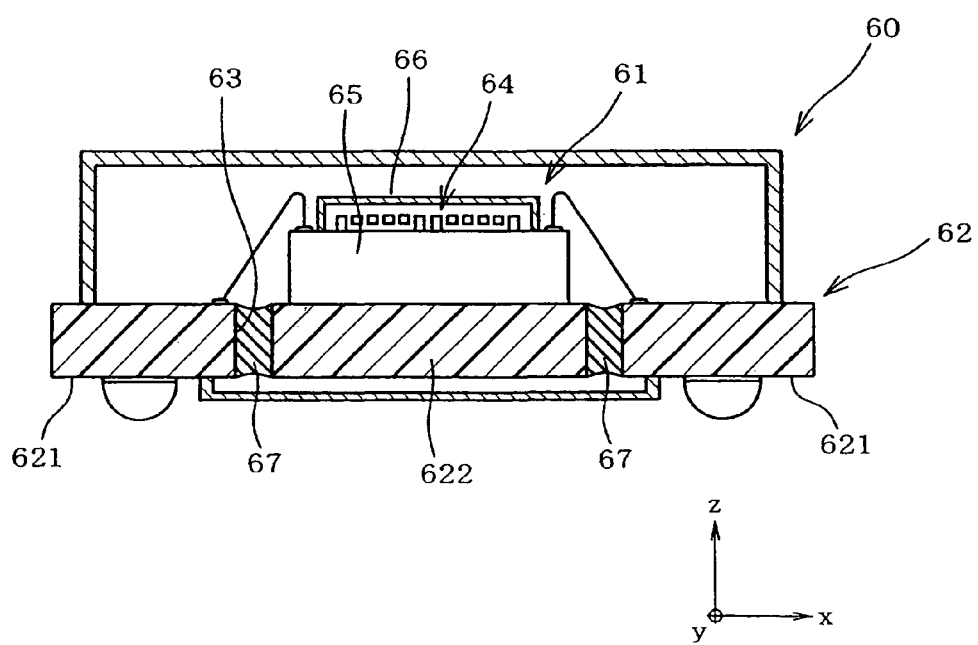
FIG. 12 is a diagram illustrating a cross-sectional view of a physical quantity sensor according to a seventh embodiment of the present invention.

As shown in FIG. 12, in the seventh embodiment, the sensor chip 65 is mounted on the organic substrate 62. Specifically, the organic substrate 62 includes a frame portion 621 and a mounting portion 622 on which the sensor chip 65 is mounted. The sensor chip 65 and the mounting portion 622 construct the sensor portion 61. The vibration isolator 67 is located between the frame portion 621 and the mounting portion 622. Thus, the vibration isolator 67 reduces a vibration transmitted to the mounting portion 622, on which the sensor chip 65 is mounted, from the frame portion 621. Accordingly, a relative vibration between the sensor portion 61 and the frame portion 621 of the organic substrate 62 can be reduced.

(Eight Embodiment)

A physical quantity sensor 10 according to an eighth embodiment of the present invention is described below with reference to FIG. 13. The eighth embodiment is a modification of the first embodiment.

Figure 13:
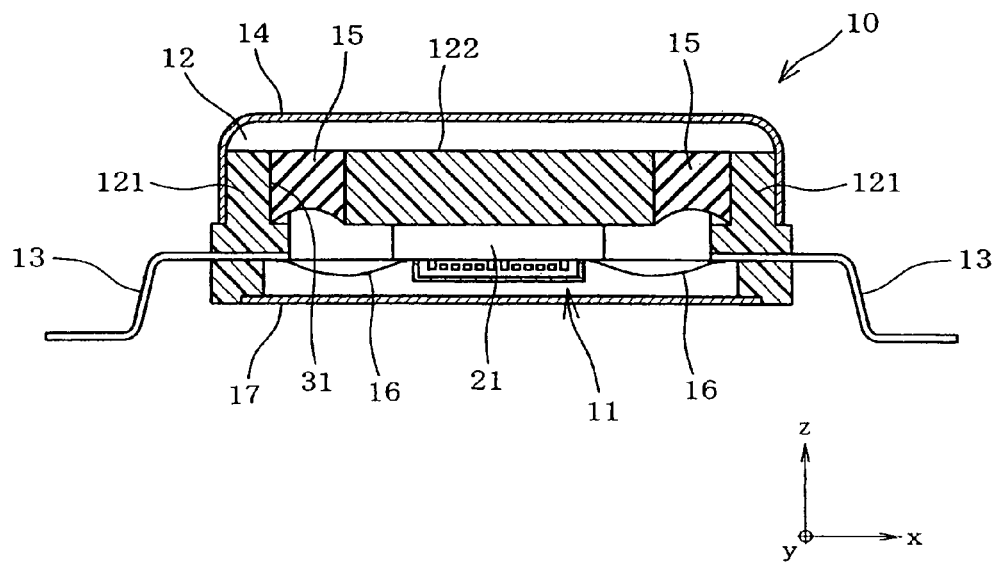
FIG. 13 is a diagram illustrating a cross-sectional view of a physical quantity sensor according to an eighth embodiment of the present invention.

In the eighth embodiment, as shown in FIG. 13, the casing 12 includes a frame portion 121 and a mounting portion 122 on which the sensor chip 21 is mounted. The sensor chip 21 and the mounting portion 122 construct the inner unit 11 as a sensor portion. The vibration isolator 15 is located between the frame portion 121 and the mounting portion 122 of the casing 12. Thus, the vibration isolator 15 reduces a vibration transmitted to the mounting portion 122, on which the sensor chip 21 is mounted, from the frame portion 121. Accordingly, a relative vibration between the inner unit 11 and the frame portion 121 of the casing 12 can be reduced.

(Ninth Embodiment)

Figure 15:
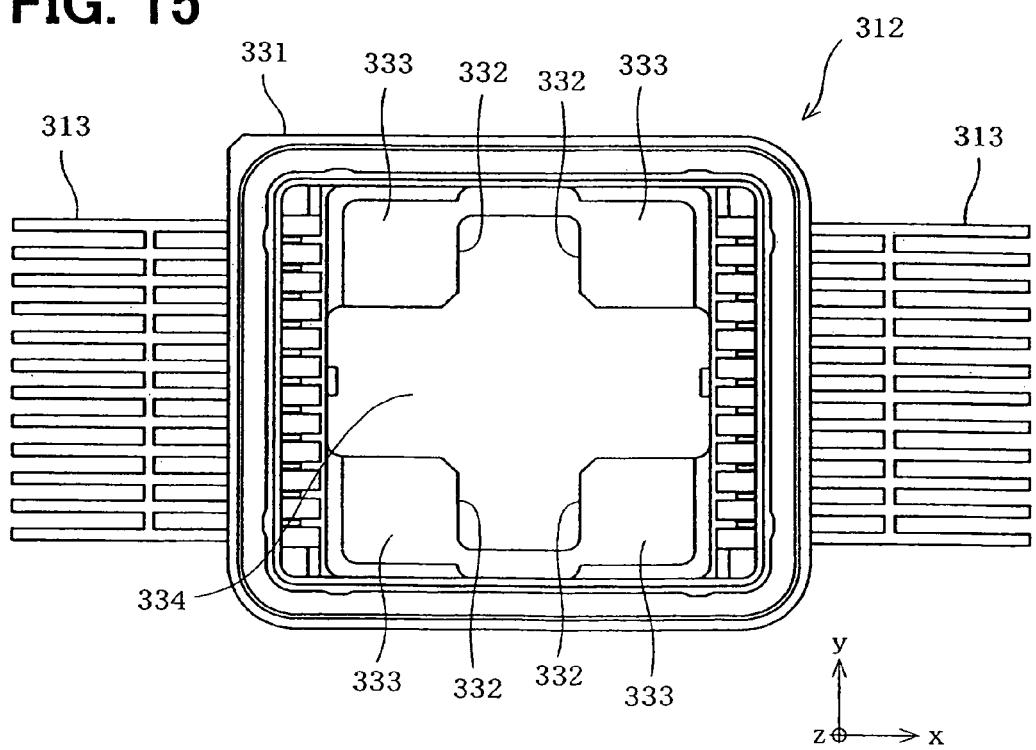
FIG. 15 is a diagram illustrating a plan view of a casing of the physical quantity sensor of the ninth embodiment.
Figure 14A:
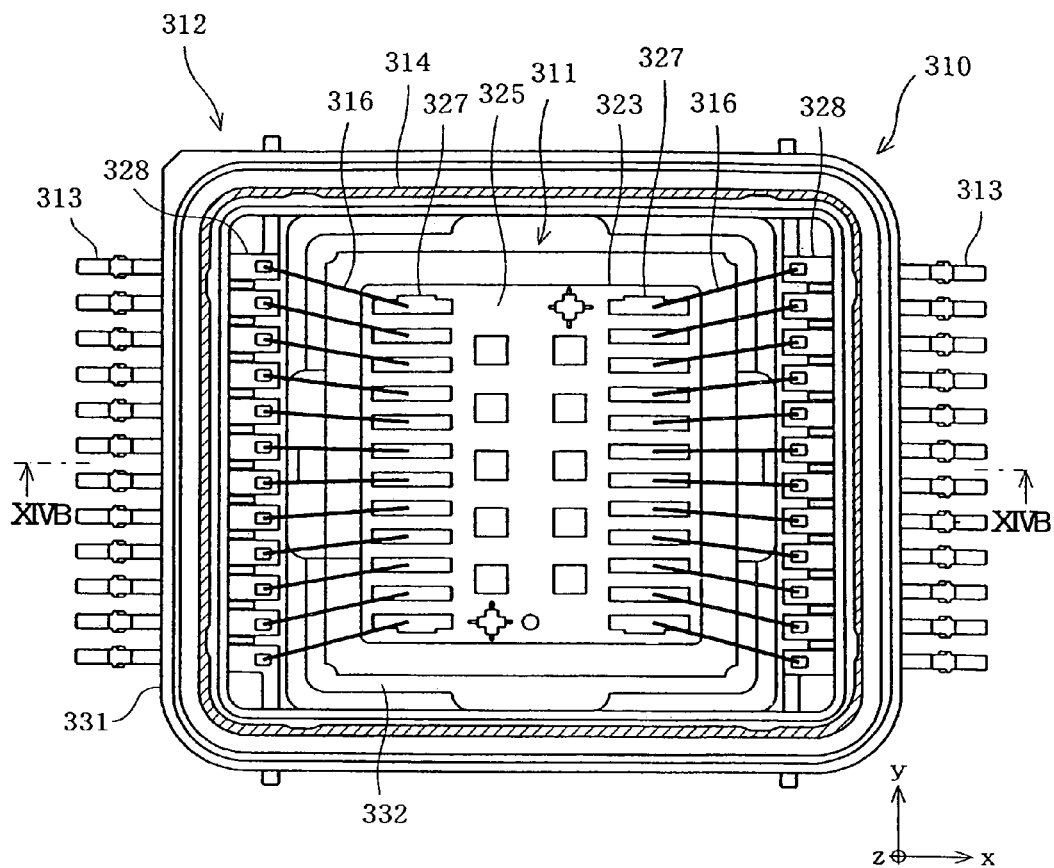
FIG. 14A is a diagram illustrating a plan view of a physical quantity sensor according to a ninth embodiment of the present invention.

A physical quantity sensor 310 according to a ninth embodiment of the present invention is described below with reference to FIGS. 14A, 14B, and 15. The physical quantity sensor 310 includes an inner unit 311 (as a sensor portion), a casing 312, a lead frame 313, a cover 314, a vibration isolator 315, a bonding wire 316, and a cover 317. The inner unit 311 includes a sensor chip 321, a signal processing chip 322, a package 323, and a lid 324. The sensor chip 321 has substantially the same structure as the sensor chip 21 shown in FIG. 3.

The inner unit 311 is held in the casing 312. The casing 312 is made of resin. The casing 312 has a rectangular tube shape. The lead frame 313 is insert-molded with the casing 312. The inner unit 311 has first and second end surfaces 325, 326 opposite to each other in its thickness direction. That is, the inner unit 311 has the opposing end surfaces 325, 326 in the z-axis direction in FIG. 14B. The package 323 is located on the first end surface 325, and the lid 324 is located on the second end surface 326. The cover 314 covers the first end surface 325 of the inner unit 311. The cover 317 covers the second end surface 326 of the inner unit 311.

The inner unit 311 has a pad 327 on the first end surface 325. The pad 327 is electrically connected to each of the sensor chip 321 and the signal processing chip 322. The casing 312 has a pad 328 that is electrically connected to the lead frame 313. The pad 327 of the inner unit 311 is electrically connected to the pad 328 of the casing 312 through the bonding wire 316. Thus, the inner unit 311 is electrically connected to the lead frame 313 through the bonding wire 316.

The casing 312 includes a casing body 331 and a supporting portion 332. The casing body 331 has a rectangular tube shape and surrounds the periphery of the inner unit 311. The supporting portion 332 extends from an inner wall of the casing body 331 to provide a supporting surface 333 that faces the second end surface 326 of the inner unit 311. In the ninth embodiment, as shown in FIG. 15, the supporting portion 332 extends inwardly from each corner of the casing body 331 to form a substantially cross-shaped opening 334 between the casing body 331 and the supporting portion 332. The cross-shaped opening 334 extends in the z-axis direction to penetrate through the supporting portion 332.

Figure 14B:
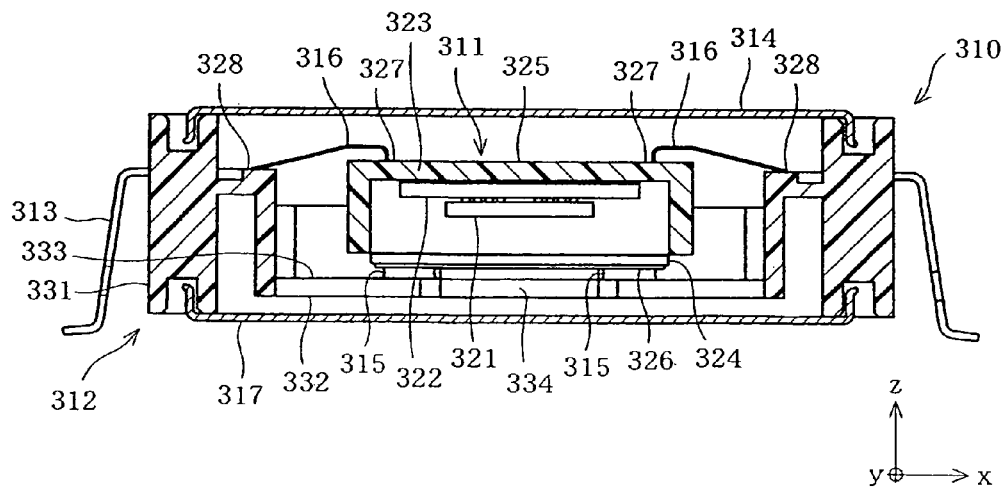
FIG. 14B is a diagram illustrating a cross-sectional view taken along line XIVB-XIVB in FIG. 14A.

As shown in FIG. 14B, the vibration isolator 315 is located between the second end surface 326 of the inner unit 311 and the supporting surface 333 of the casing 312. The inner unit 311 and the casing 312 are joined (e.g., bonded) together through the vibration isolator 315. Thus, the inner unit 311 is supported to the supporting portion 332 of the casing 312 through the vibration isolator 315. For example, the vibration isolator 315 can be made of soft elastomer such as silicone rubber, room temperature vulcanization (RTV) silicone rubber, or the like.

Figure 16A:
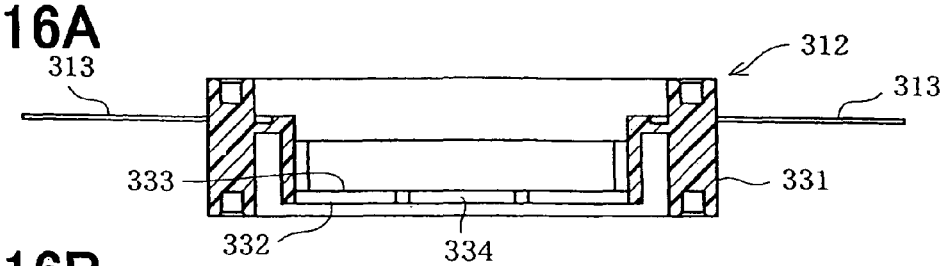
FIGS. 16A-16F are diagrams illustrating a method of making the physical quantity sensor of the ninth embodiment.
Figure 16B:
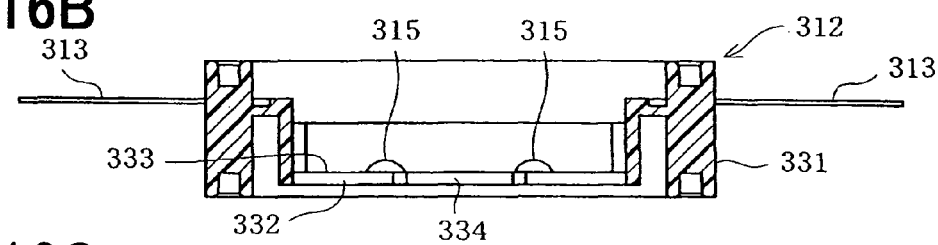
Figure 16C:
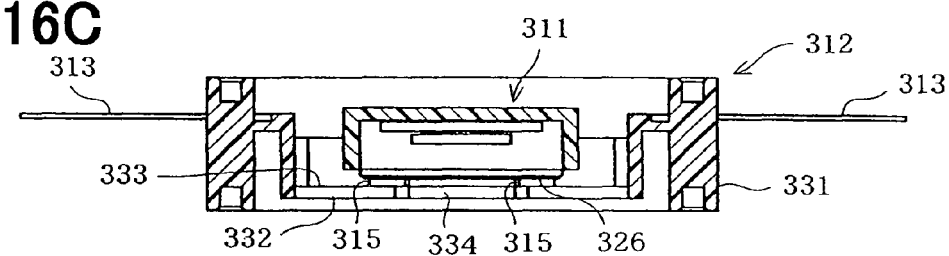

An example of a method of making the physical quantity sensor 310 is described below with reference to FIGS. 16A-16F. Firstly, as shown in FIG. 16A, the lead frame 313 is insert-molded with the casing 312 so that the casing 312 and the lead frame 313 can be joined together. Then, as shown in FIG. 16B, elastomer for the vibration isolator 315 is applied to the supporting surface 333 of the supporting portion 332. The elastomer is in the form of a liquid or a semi-solid, when applied to the supporting surface 333. Then, as shown in FIG. 16C, the inner unit 311 is attached to the casing 312 through the applied elastomer, before the applied elastomer cures (i.e., hardens). When the elastomer cures to form the vibration isolator 315, the inner unit 311 and the casing 312 are joined together through the vibration isolator 315.

Figure 16D:
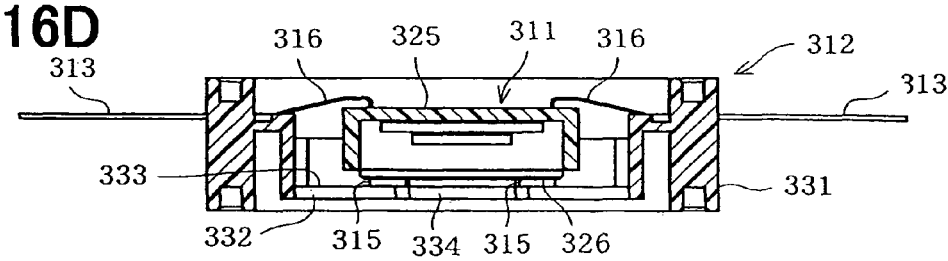

After the elastomer cures to form the vibration isolator 315, the inner unit 311 and the casing 312 are electrically connected together through the bonding wire 316, as shown in FIG. 16D. In the ninth embodiment, the vibration isolator 315 is located on the second end surface 326 of the inner unit 311, and the bonding wire 316 is located on the first end surface 325 of the inner unit 311. That is, the vibration isolator 315 and the bonding wire 316 are located on different sides of the inner unit 311. Therefore, a manufacturing step for applying the elastomer and a manufacturing step for connecting the bonding wire 316 can be performed without interference with each other.

Figure 16E:
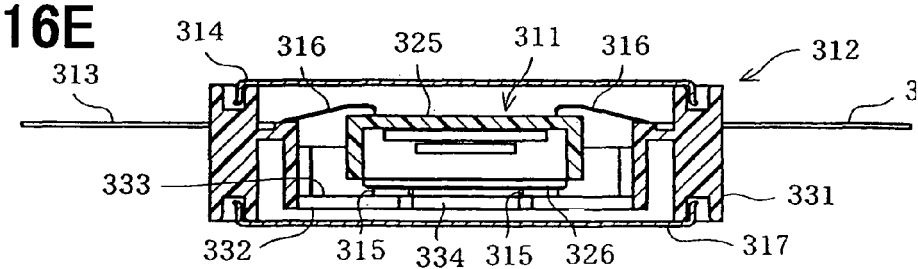
Figure 16F:
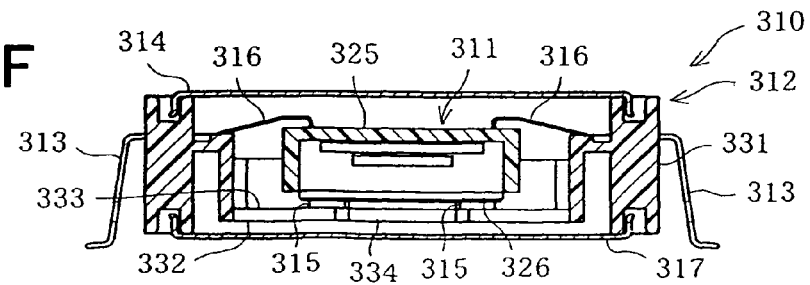

Then, as shown in FIG. 16E, the cover 314 and the cover 317 are attached to the casing 312. Finally, as shown in FIG. 16F, the lead frame 313 is formed in a predetermined shape. Further, unnecessary portions connecting adjacent lead frames 313 (refer to FIG. 15) are removed so that the lead frames 313 can be separated from each other (refer to FIG. 14A). In this way, the physical quantity sensor 310 is completed.

Figure 17:
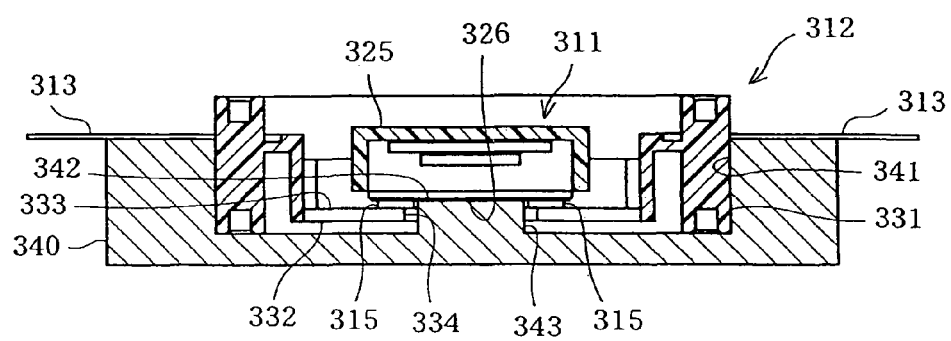
FIG. 17 is a diagram corresponding to FIG. 16C in which a jig is attached to the casing.

As described above, the casing 312 has the opening 334 that penetrates through the supporting portion 332. As shown in FIG. 17, a jig 340 can be used to make the physical quantity sensor 310 by inserting the jig 340 in the opening 334. The jig 340 includes a holding portion 341, a contact portion 342, and a columnar portion 343. The holding portion 341 holds the casing 312. The columnar portion 343 extends upward from the holding portion 341 so as to pass through the opening 334 of the casing 312. The contact portion 342 is located on a tip of the columnar portion 343 to be in contact with the second end surface 326 of the inner unit 311. When the casing 312 is held in the holding portion 341, a positional relationship between the casing 312 and the contact portion 342 of temporally supporting jig 340 is kept constant. That is, a distance between the second end surface 326 of the inner unit 311 and the supporting surface 333 of the casing 312 is kept constant.

The distance between the second end surface 326 and the supporting surface 333 corresponds to the thickness of the vibration isolator 315. The vibration damping property of the vibration isolator 315 depends on the spring constant of the vibration isolator 315. That is, the vibration damping property of the vibration isolator 315 depends on the thickness of the vibration isolator 315. Therefore, it is preferable that the thickness of the vibration isolator 315 be kept constant so as to reduce manufacturing variations. In the ninth embodiment, the columnar portion 343 of the jig 340 can be inserted in the opening 334 of the casing 312 as shown in FIG. 17, when the inner unit 311 is attached to the casing 312 in a manufacturing step shown in FIG. 16C. In such an approach, the distance between the second end surface 326 and the supporting surface 333 is kept constant, and accordingly the thickness of the vibration isolator 315 is kept constant. Thus, the vibration damping property of the vibration isolator 315 can be accurately adjusted to a desired value.

The jig 340 can have a magnet such as a permanent magnet or an electromagnet, and a lid 324 of the inner unit 311 can be made of a magnetic material such as iron or iron-nickel-cobalt alloy. In such an approach, the inner unit 311 is detachably fixed to the jig 340 by magnetic force. Thus, the inner unit 311 can be surely supported by the jig 340, until the elastomer cures to from the vibration isolator 315.

Figure 18:
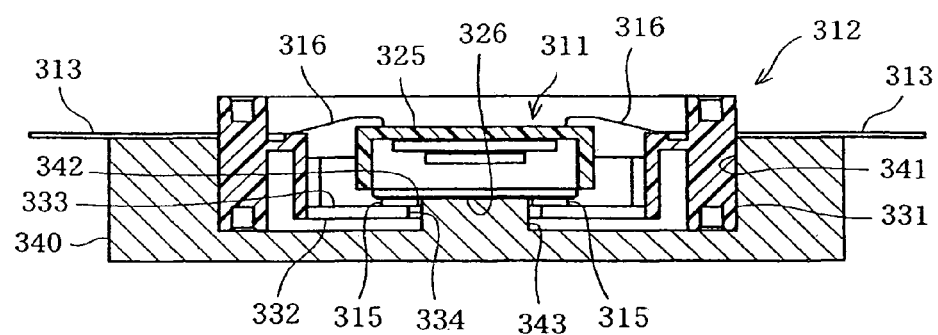
FIG. 18 is a diagram corresponding to FIG. 16D in which the jig is attached to the casing.

In addition to the above described advantage, the use of the jig 340 can provide the following advantage. The columnar portion 343 of the jig 340 can be inserted in the opening 334 of the casing 312 as shown in FIG. 18, when the inner unit 311 and the casing 312 are electrically connected together through the bonding wire 316 in a manufacturing step shown in FIG. 16D. In such an approach, even when the vibration isolator 315 is soft, the inner unit 311 can be accurately positioned with respect to the casing 312. Therefore, the inner unit 311 and the casing 312 can be accurately connected together through the bonding wire 16.

As described above, according to the ninth embodiment, the inner unit 311 and the casing 312 are joined together through the vibration isolator 315 made of soft elastomer. The vibration isolator 315 is located between the second end surface 326 of the inner unit 311 and the supporting surface 333 of the casing 312. That is, the inner unit 311 and the casing 312 are not in direct contact with each other. Since the vibration isolator 315 is soft, the vibration isolator 315 absorbs a relative vibration between the inner unit 311 and the casing 312 while supporting the inner unit 311 to the casing 312. The strength and the spring constant of the vibration isolator 315 can be easily adjusted by changing the thickness of the vibration isolator 315 and the percentage of bubbles contained in the vibration isolator 315. Therefore, a spring constant of the vibration isolator 315 can be easily adjusted to a desired value that allows the vibration isolator 315 to reduce the relative vibration between the inner unit 311 and the casing 312 without a reduction in the strength.

The casing 312 has the opening 334 that penetrates through the supporting portion 332, and the jig 340 can be used to make the physical quantity sensor 310 by inserting the jig 340 in the opening 334. The spring constant of the vibration isolator 315 depends on the thickness of the vibration isolator 315. The distance between the second end surface 326 of the inner unit 311 and the supporting surface 333 of the casing 312 can be accurately adjusted by supporting by the inner unit 311 with the jig 340. Accordingly, the thickness of the vibration isolator 315 is accurately adjusted so the vibration isolator 315 can have a desired spring constant. Further, the inner unit 311 can be accurately positioned with respect to the casing 312 by supporting the inner unit 311 with the jig 340. Therefore, the inner unit 311 and the casing 312 can be accurately connected together through the bonding wire 16.

(Tenth Embodiment)

Figure 19A:
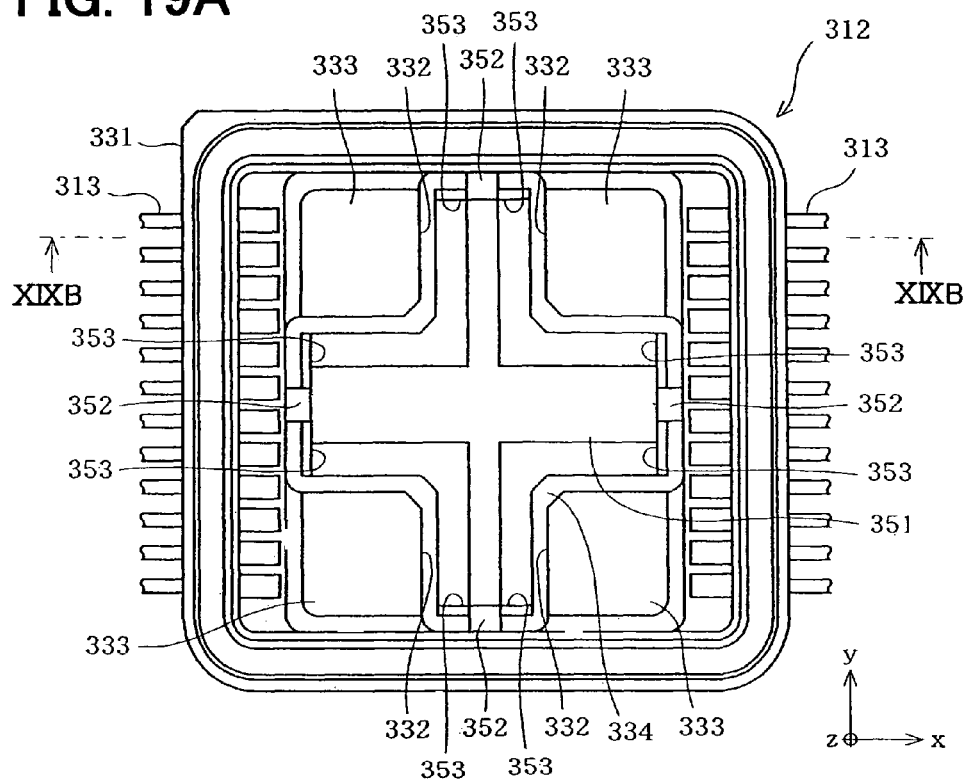
FIG. 19A is a diagram illustrating a plan view of a physical quantity sensor according to a tenth embodiment of the present invention.
Figure 19B:
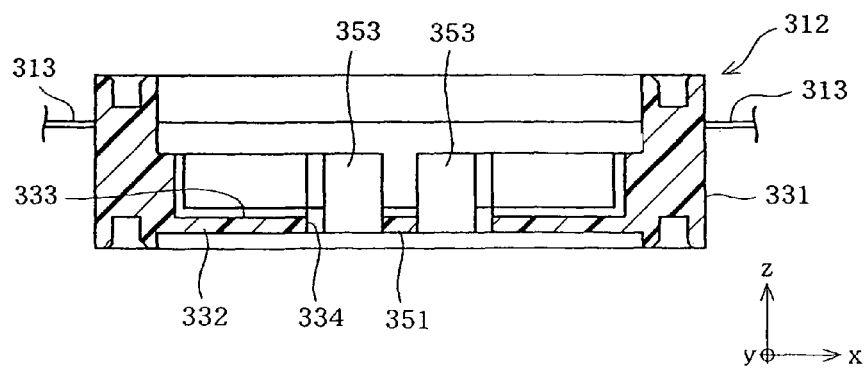
FIG. 19B is a diagram illustrating a cross-sectional view taken along line XIXB-XIXB in FIG. 19A.

A physical quantity sensor 310 according to a tenth embodiment of the present invention is described below with respect to FIGS. 19A and 19B. A difference between the ninth and tenth embodiments is as follows.

In the tenth embodiment, the casing 312 has a temporally supporting member 351. The temporally supporting member 351 is joined to the casing 312 via a separation portion 352. That is, the casing 312, the temporally supporting member 351, and the separation portion 352 are formed as one piece. The temporally supporting member 351 can be removed from the casing 312 by cutting the separation portion 352. Thus, the temporally supporting member 351 is removablely fixed to the casing 312.

The physical quantity sensor 310 has a guide member 353. The guide member 353 is located on an inner wall of the casing 312 to face an outer wall of the inner unit 311. When the inner unit 311 is held in the casing 312, the guide member 353 comes in contact with the outer wall of the inner unit 311 so that the inner unit 311 can be accurately positioned with respect to the casing 312. In this way, the guide member 353 defines a horizontal position of the inner unit 311 with respect to the casing 312.

Figure 20A:
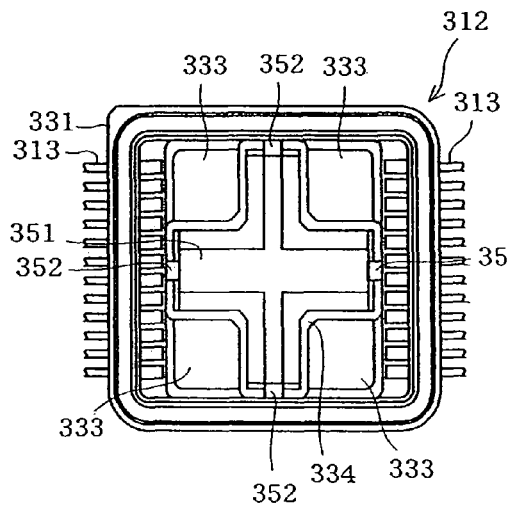
FIGS. 20A-20D are diagrams illustrating a method of making the physical quantity sensor of the tenth embodiment.
Figure 20B:
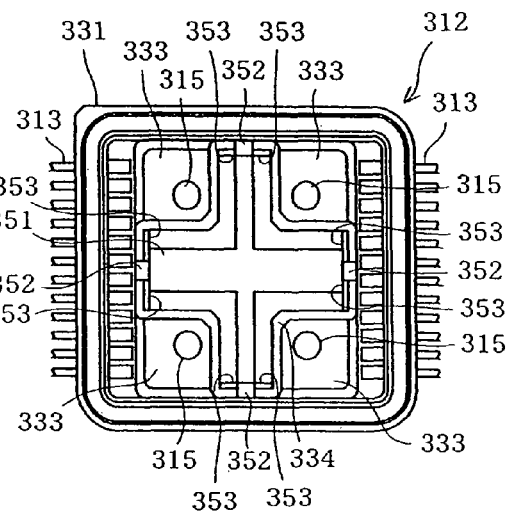
Figure 20C:
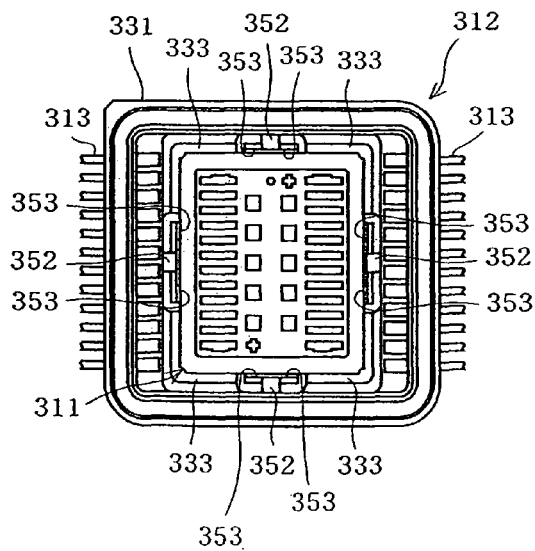

An example of a method of making the physical quantity sensor 310 of the tenth embodiment is described below with reference to FIGS. 20A-20D. Firstly, as shown in FIG. 20A, the lead frame 313 is insert-molded with the casing 312 so that the casing 312 and the lead frame 313 can be joined together. In the condition, the temporally supporting member 351 remains joined to the casing 312 via the separation portion 352. Then, as shown in FIG. 20B, elastomer for the vibration isolator 315 is applied to the supporting surface 333 of the supporting portion 332. Then, as shown in FIG. 20C, the inner unit 311 is attached to the casing 312 though the elastomer, before the elastomer cures (i.e., hardens). In this time, since the inner unit 311 is supported by the temporally supporting member 351, the second end surface 326 of the inner unit 311 is not in direct contact with the supporting surface 333. Like the jig 340 of the ninth embodiment, the temporally supporting member 351 defines the distance between the second end surface 326 of the inner unit 311 and the supporting surface 333 of the casing 312. That is, the temporally supporting member 351 defines the thickness of the vibration isolator 315. The horizontal position of the inner unit 311 is determined by the guide member 353, which is in contact with the outer wall of the inner unit 311.

Figure 20D:
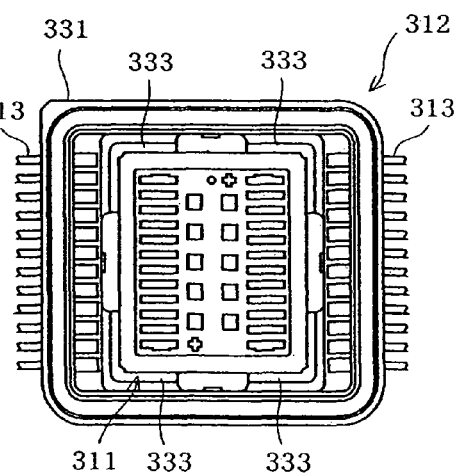

After the elastomer cures to form the vibration isolator 315, the temporally supporting member 351 is removed from the casing 312 as shown in FIG. 20D. For example, the temporally supporting member 351 can be removed from the casing 312 by melting the separation portion 352 with laser beam.

As described above, according to the tenth embodiment, the casing 312 has the temporally supporting member 351 that is located to cover the opening 334 and removable from the casing 312. Further, the guide member 353 is located on the inner wall of the casing 312 to face the outer wall of the inner unit 311. The inner unit 311 is attached to the casing 312 such that the inner unit 311 is supported by the temporally supporting member 351 and such that the guide member 353 is in contact with the outer wall of the inner unit 311. In such an approach, the inner unit 311 can be accurately positioned with respect to the casing 312. Accordingly, the vibration isolator 315 can have a desired thickness and a desired spring constant. The inner unit 311 is supported to the casing 312 through the vibration isolator 315, after the temporally supporting member 351 is removed from the casing 312. In this way, the spring constant of the vibration isolator 315 can be easily and accurately adjusted to a desired value.

(Eleventh Embodiment)

An eleventh embodiment of the present invention is described below with reference to FIG. 21.

Figure 21:
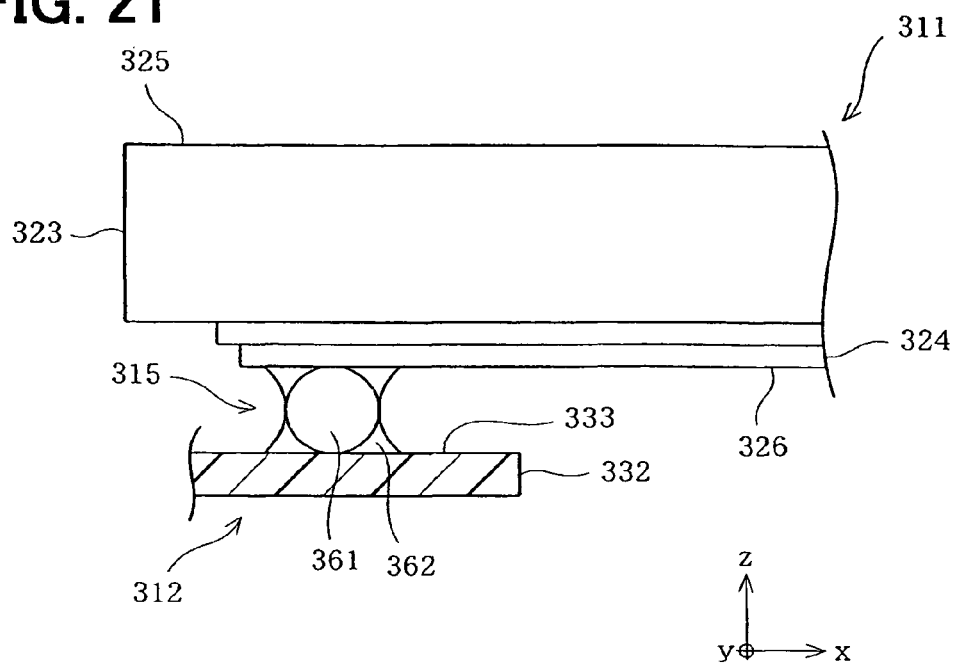
FIG. 21 is a diagram illustrating a main portion of a physical quantity sensor according to an eleventh embodiment of the present invention.

In the eleventh embodiment, as shown in FIG. 21, the vibration isolator 315 includes a distance setting member 361 and an adhesive member 362. The distance setting member 361 is in the form of a solid. The adhesive member 362 is in the form of a liquid or a semi-solid and becomes solid after curing. The distance setting member 361 and the adhesive member 362 can be made of the same material. For example, the distance setting member 361 and the adhesive member 362 can be made of a soft material such as elastomer. Alternatively, the distance setting member 361 and the adhesive member 362 can be made of different materials.

In the eleventh embodiment, the distance setting member 361 is sandwiched between the second end surface 326 of the inner unit 311 and the supporting surface 333 of the casing 312, when the inner unit 311 is attached to the casing 312. Since the distance setting member 361 is in the form of a solid, the distance between the second end surface 326 of the inner unit 311 and the supporting surface 333 of the casing 312 is determined by the distance setting member 361. That is, the distance setting member 361 defines the distance between the inner unit 311 and the casing 312. The adhesive member 362 is applied around the distance setting member 361 so that the distance setting member 361 can be covered with the adhesive member 362. The inner unit 311 and the casing 312 are joined (i.e., bonded) together, when the adhesive member 362 cures.

As described above, according to the eleventh embodiment, the vibration isolator 315 includes the distance setting member 361 and the adhesive member 362. The inner unit 311 is softly supported to the casing 312 through the distance setting member 361 and joined to the casing 312 through the adhesive member 362. The adhesive member 362 is applied to the distance setting member 361 in the condition where the inner unit 311 is supported to the casing 312 through the distance setting member 361. In such an approach, the inner unit 311 and the casing 312 are joined together while keeping the distance between the inner unit 311 and the casing 312 to a predetermined distance defined by the distance setting member 361. A spring constant of the vibration isolator 315 depends on the size of the distance setting member. Therefore, the spring constant of the vibration isolator 315 can be easily and accurately adjusted to a desired value by changing the size of the distance setting member 361.

(Twelfth Embodiment)

An eleventh embodiment of the present invention is described below with reference to FIG. 22.

Figure 22:
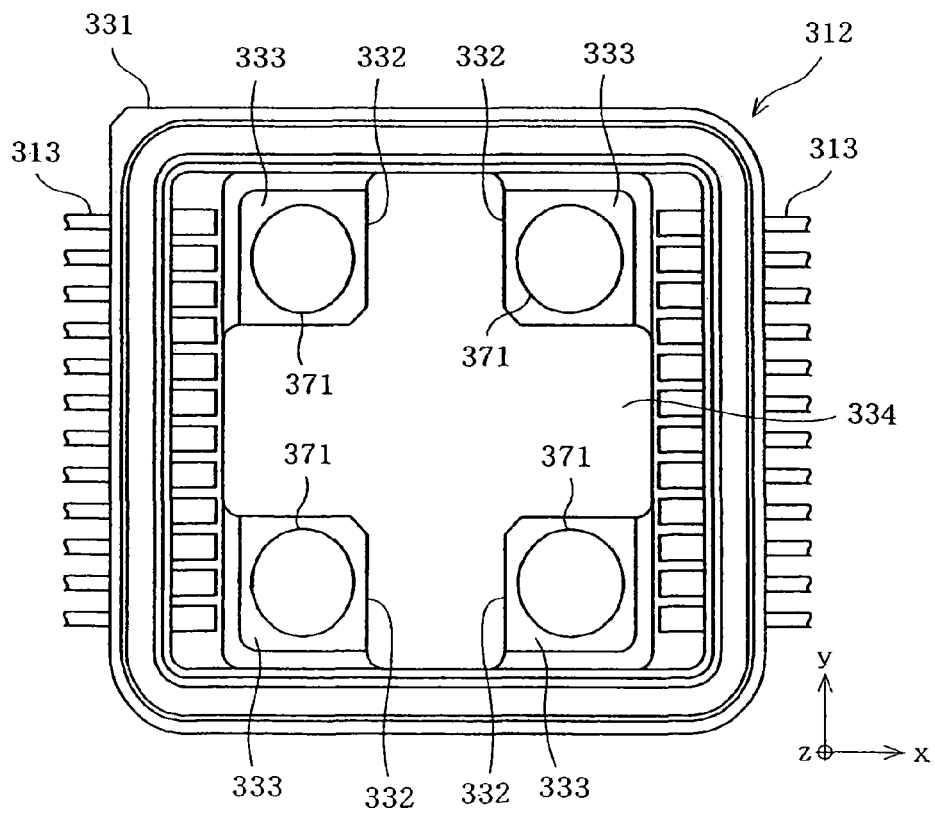
FIG. 22 is a diagram illustrating a plan view of a casing of a physical quantity sensor according to a twelfth embodiment of the present invention.

In the eleventh embodiment, as shown in FIG. 22, the supporting surface 333 of the supporting portion 332 is slightly recessed to form a recessed portion 371 having a predetermined depth. In FIG. 22, the recessed portion 371 is circular. Alternatively, the recessed portion 371 can have a shape other than a circle. The elastomer for the vibration isolator 315 is applied to the recessed portion 371. Since the recessed portion 371 has a predetermined depth, the elastomer applied to the recessed portion 371 can remain within the recessed portion 371 despite the fact that the elastomer is in the form of a liquid or a semi-solid. Thus, the vibration isolator 315 can be formed in a correct position on the supporting surface 333. That is, the recessed portion 371 defines a position of the vibration isolator 315. Further, when the vibration isolator 315 includes the distance setting member 361 of the eleventh embodiment, the vibration isolator 315 can be formed in a correct position by placing the distance setting member 361 in the recessed portion 371.

As described above, according to the eleventh embodiment, the supporting portion 332 has the recessed portion 371 on the supporting surface 333. The vibration isolator 315 can be easily formed in a correct position by using the recessed portion 371.

(Thirteenth Embodiment)

Figure 23:
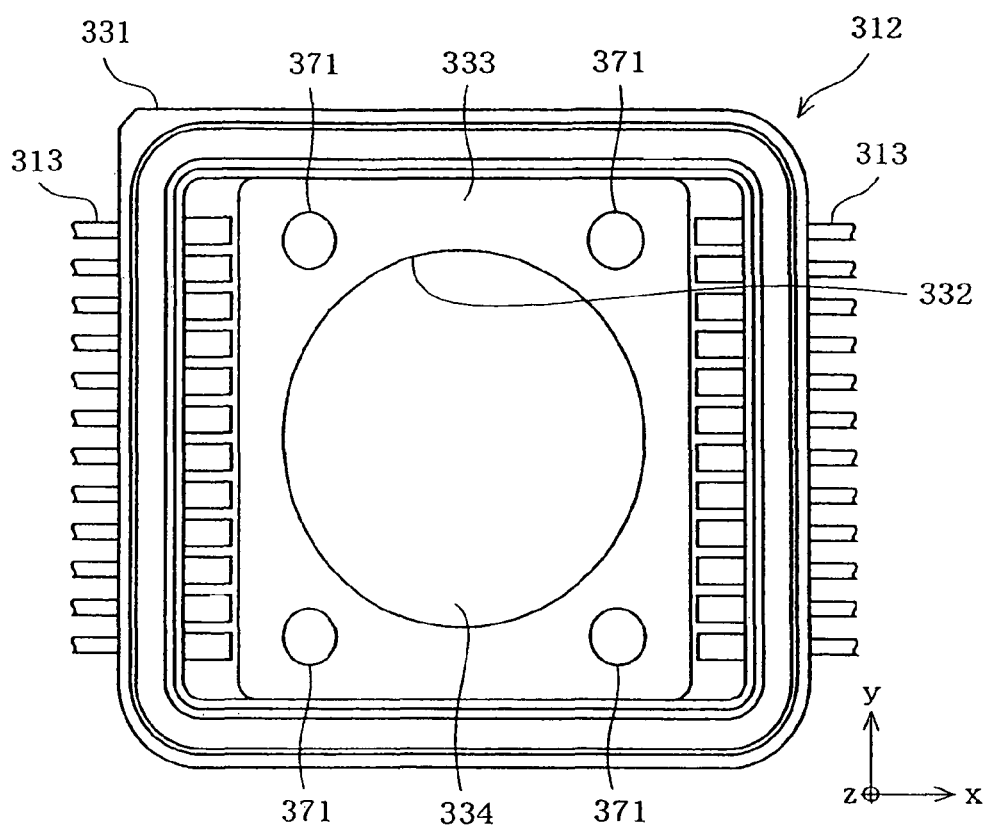
FIG. 23 is a diagram illustrating a plan view of a casing of a physical quantity sensor according to a thirteenth embodiment of the present invention.

A thirteenth embodiment of the present invention is described below with reference to FIG. 23. A difference between the thirteenth embodiment and the preceding embodiments is as follows. In the preceding embodiments, the opening 334 of the casing 312 has a cross shape. In contrast, in the thirteenth embodiment, the opening 334 of the casing 312 has a circular shape, and the supporting portion 332 is formed between the circular opening 334 and the casing body 331. Like the twelfth embodiment, the supporting surface 333 of the supporting portion 332 can be recessed to form the recessed portion 371.

As described above, according to the thirteenth embodiment, the opening 334 of the casing 312 has a circular shape. That is, the opening 334 of the casing 312 is not limited to a specific shape such as a cross shape.

(Fourteenth Embodiment)

A fourteenth embodiment of the present invention is described below with reference to FIG. 24.

Figure 24:
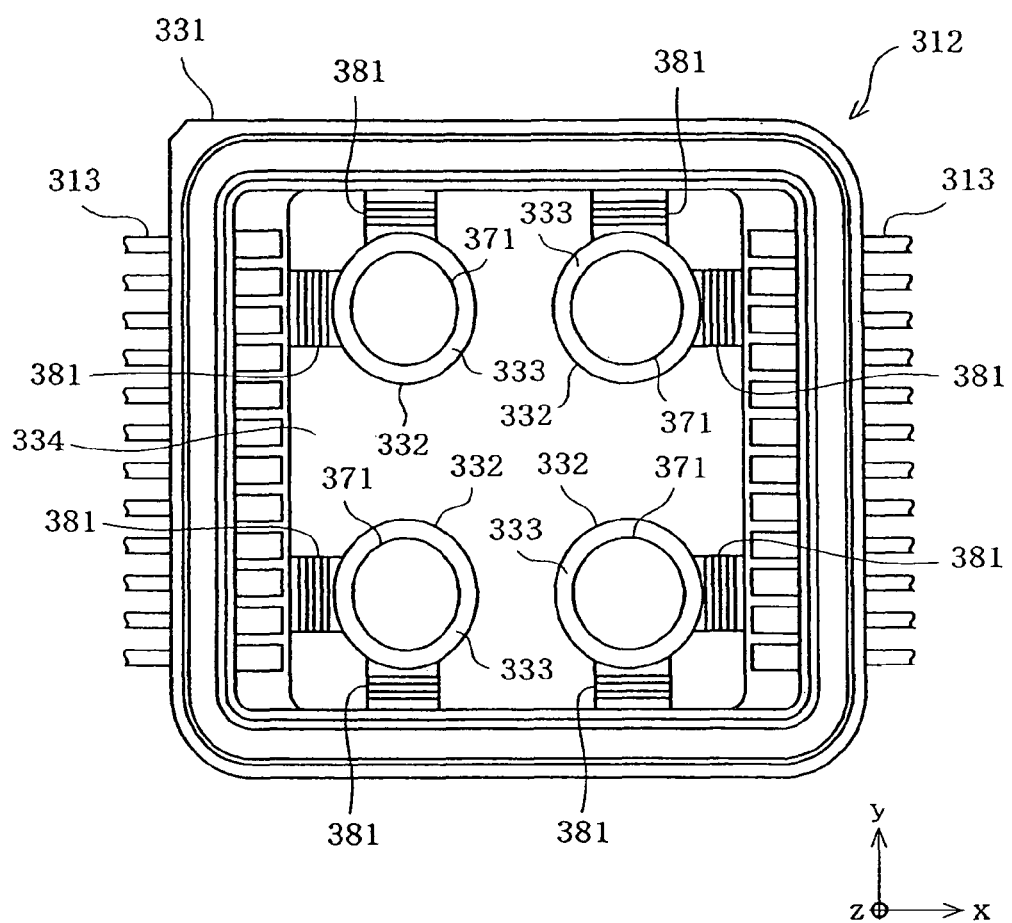
FIG. 24 is a diagram illustrating a plan view of a casing of a physical quantity sensor according to a fourteenth embodiment of the present invention.

In the fourteenth embodiment, as shown in FIG. 24, the casing 312 has an elastic supporting member 381 that is located between the casing body 331 and the supporting portion 332. That is, the casing body 331 and the supporting portion 332 are provided as separate pieces and then joined together through the elastic supporting member 381. For example, the elastic supporting member 381 is made of an elastic member such as a coil spring (i.e., helical spring).

Since the supporting portion 332 is supported to the casing body 331 through the elastic supporting member 381, the supporting portion 332 can be displaced relative to the casing body 331. Further, the supporting portion 332 can be displaced relative to the inner unit 311 due to the vibration isolator 315 located between the supporting surface 333 of the supporting portion 332 and the second end surface 326 of the inner unit 311. In this way, the inner unit 311 is elastically supported to the casing 312 through not only the vibration isolator 315 but also the elastic supporting member 381. Accordingly, a vibration transmitted to the inner unit 311 from the casing 312 is absorbed by not only the vibration isolator 315 but also the elastic supporting member 381. Therefore, a relative vibration between the inner unit 311 and the casing 312 can be effectively reduced.

(Fifteenth Embodiment)

A physical quantity sensor 410 according to a fifteenth embodiment of the present invention is described below with reference to FIGS. 25A and 25B.

The physical quantity sensor 410 includes an inner unit 411 (as a sensor portion), a casing 412, a lead frame 413, a first vibration isolator 415, a bonding wire 416, and a second vibration isolator 418. The inner unit 411 has the substantially same structure as the inner units of the preceding embodiments. Although not shown in FIGS. 25A and 25B, the physical quantity sensor 410 further includes a cover for protecting the inner unit 411. The first and second vibration isolators 415, 418 form a vibration isolation structure.

The inner unit 411 is held in the casing 412. The casing 412 is made of resin. The casing 412 has a rectangular tube shape. The lead frame 413 is insert-molded with the casing 412. The inner unit 411 has first and second end surfaces 425, 426 opposite to each other in its thickness direction. That is, the inner unit 411 has the opposing end faces 425, 426 in the z-axis direction in FIG. 25B.

Figure 25A:
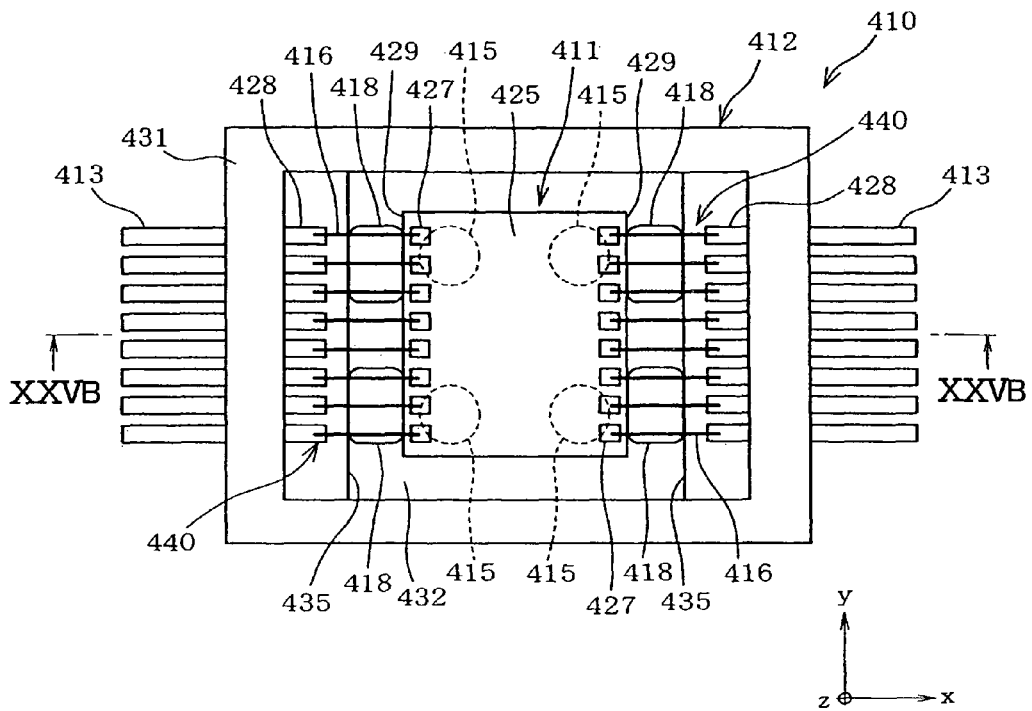
FIG. 25A is a diagram illustrating a plan view of a physical quantity sensor according to a fifteenth embodiment of the present invention.

As shown in FIG. 25A, the inner unit 411 has a pad 427 on the first end surface 425. The pad 427 is electrically connected to each of a sensor chip (not shown) and a signal processing chip (not shown). The casing 412 has a pad 428 that is electrically connected to the lead frame 413. The pad 427 of the inner unit 411 is electrically connected to the pad 428 of the casing 412 through the bonding wire 416 so that the inner unit 411 can be electrically connected to the lead frame 413.

The casing 412 includes a casing body 431 and a supporting portion 432. The casing body 431 has a rectangular tube shape and surrounds the periphery of the inner unit 411. The supporting portion 432 extends from an inner wall of the casing body 431 to provide a supporting surface 433 that faces the second end surface 426 of the inner unit 411. The supporting portion 432 has an opening 434 in its center. The opening 434 penetrates the supporting portion 332 in a thickness direction of the supporting portion 432. Alternatively, the supporting portion 432 and the opening 434 can have the same shape as the supporting portion 332 and the opening 334 of the ninth embodiment.

Figure 25B:
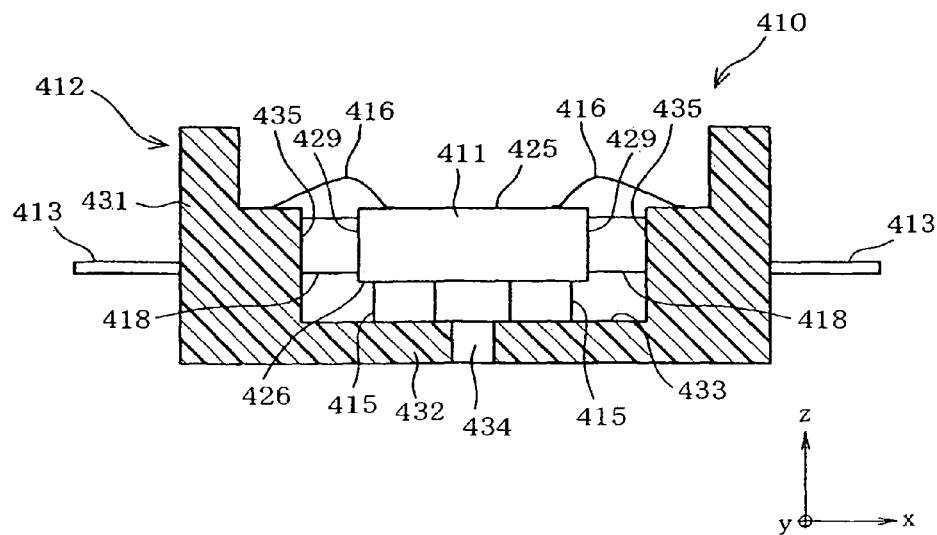
FIG. 25B is a diagram illustrating a cross-sectional view taken along line XXVB-XXVB in FIG. 25A.

As shown in FIG. 25B, the first vibration isolator 415 is located between the second end surface 426 of the inner unit 411 and the supporting surface 433 of the casing 412. The inner unit 411 and the casing 412 are joined (e.g., bonded) together through the vibration isolator 415. Thus, the inner unit 411 is supported to the supporting portion 432 of the casing 412 through the first vibration isolator 415. For example, the first vibration isolator 415 can be made of soft elastomer such as silicone rubber, room temperature vulcanization (RTV) silicone rubber, or the like.

As shown in FIG. 25B, the second vibration isolator 418 is located between an outer side wall 429 of the inner unit 411 and an inner side wall 435 of the casing 412. Specifically, the second vibration isolator 418 is in contact with each of the outer side wall 429 and the inner side wall 435. The first and second vibration isolators 415, 418 are made of different materials so that an effective elastic modulus of the second vibration isolator 418 can be smaller than an effective elastic modulus of the first vibration isolator 415. That is, the second vibration isolator 418 is made of a material softer than a material of which the first vibration isolator 415 is made. For example, the second vibration isolator 418 can be made of a soft rubber or a gel containing oil (fat). Such a material for the second vibration isolator 418 is in the form of a liquid or a semi-solid before curing. Therefore, the material for the second vibration isolator 418 can be easily injected between the inner unit 411 and the casing 412. After the material cures to form the second vibration isolator 418, the inner unit 411 is softly supported to the casing 412 through the second vibration isolator 418.

A relative vibration between the inner unit 411 and the casing 412 contains a high frequency vibration with a relatively small amplitude and a low frequency vibration with a relatively large amplitude. As described above, the elastic modulus of the second vibration isolator 418 is smaller than the elastic modulus of the first vibration isolator 415. Therefore, the first and second vibration isolators 415, 418 have different vibration damping properties. Specifically, the first vibration isolator 415 can reduce the high frequency vibration, and the second vibration isolator 418 can reduce the low frequency vibration. Therefore, even when the relative vibration between the inner unit 411 and the casing 412 mainly contains the low frequency vibration, the low frequency vibration can be reduced by the second vibration isolator 418.

Further, the second vibration isolator 418 is located between the outer side wall 429 of the inner unit 411 and the inner side wall 435 of the casing 412, and the bonding wire 416 connected between the inner unit 411 and the casing 412 is located to straddle the second vibration isolator 418. In such an approach, the second vibration isolator 418 limits a change in distance between a first junction between the inner unit 411 and the bonding wire 416 and a second junction between the casing 412 and the bonding wire 416 so that tensile and compressive forces applied to the bonding wire 416 can be reduced.

As shown in FIG. 25A, multiple bonding wires 416 are arranged in parallel in a direction (i.e., y-axis direction in FIG. 25A) perpendicular to a length direction of each bonding wire 416 so as to from an electrical connection region 440. Specifically, the electrical connection region 440 is formed between outermost bonding wires 416 in the direction. The second vibration isolator 418 extends to outside the electrical connection region 440 in the direction. In such an approach, the second vibration isolator 418 reduces the rotation movement of the inner unit 411 with respect to the casing 412 about the z-axis direction in FIG. 25A. Accordingly, tensile and compressive forces applied to the bonding wires 416 are reduced so that it can be ensured that the inner unit 411 and the casing 412 remains connected together through the bonding wires 416. In FIG. 25A, multiple second vibration isolators 418 are spaced from each other in the electrical connection region 440. Alternatively, multiple second vibration isolators 418 can be arranged without space in the electrical connection region 440. Alternatively, one second vibration isolator 418 can be placed in the electrical connection region 440.

Figure 26A:
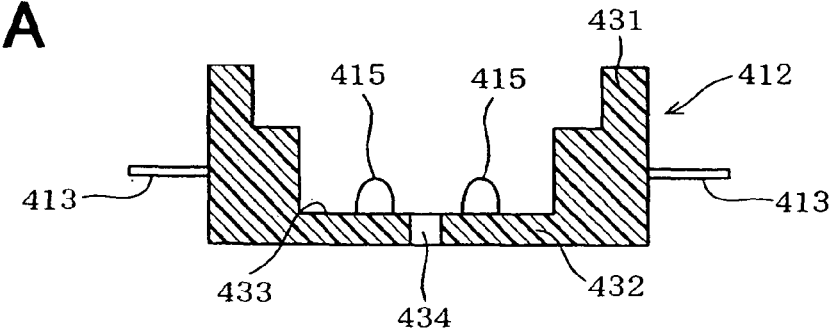
FIGS. 26A-26D are diagrams illustrating a method of making the physical quantity sensor of the fifteenth embodiment.
Figure 26B:
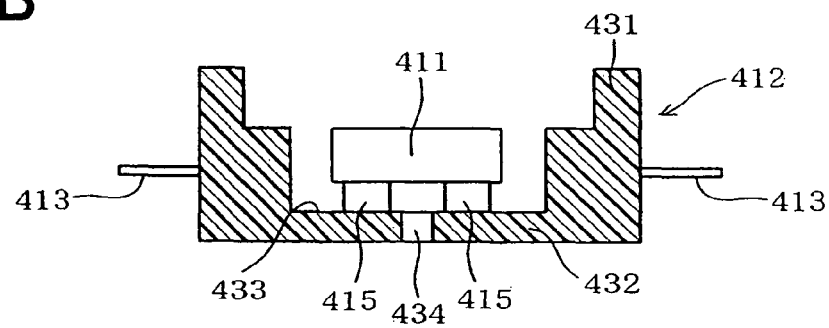

An example of a method of making the physical quantity sensor 410 of the fifteenth embodiment is described below with reference to FIGS. 26A-26D. Firstly, as shown in FIG. 26A, the lead frame 413 is insert-molded with the casing 412 so that the casing 412 and the lead frame 413 can be joined together. Further, elastomer for the first vibration isolator 415 is applied to the supporting surface 433 of the supporting portion 432. Then, as shown in FIG. 26B, the inner unit 411 is attached to the casing 412 through the elastomer, before the elastomer cures. When the elastomer cures to form the first vibration isolator 415, the inner unit 411 is supported to the casing 412 through the first vibration isolator 415.

Figure 26C:
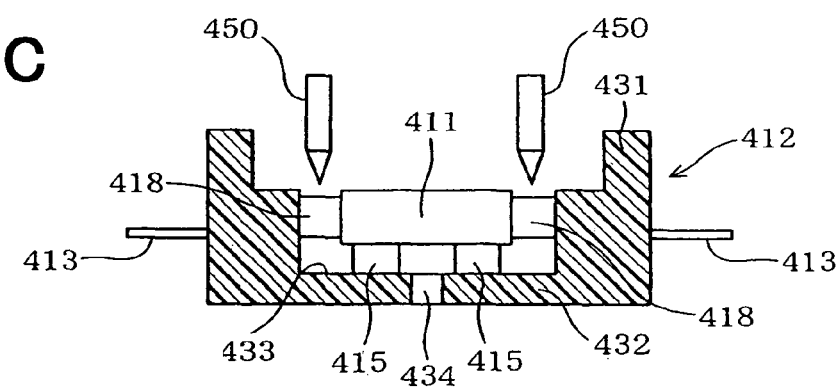

After the elastomer cures to form the first vibration isolator 415, a material (e.g., rubber or gel) for the second vibration isolator 418 is injected between the inner unit 411 and the casing 412 using a dispenser 450, as shown in FIG. 26C. The material for the second vibration isolator 418 is in the form of a liquid or a semi-solid. When the material injected between the inner unit 411 and the casing 412 cures to from the second vibration isolator 418, the second vibration isolator 418 is kept in contact with the outer side wall 419 of the inner unit 411 and the inner side wall 435 of the casing 412.

Figure 26D:
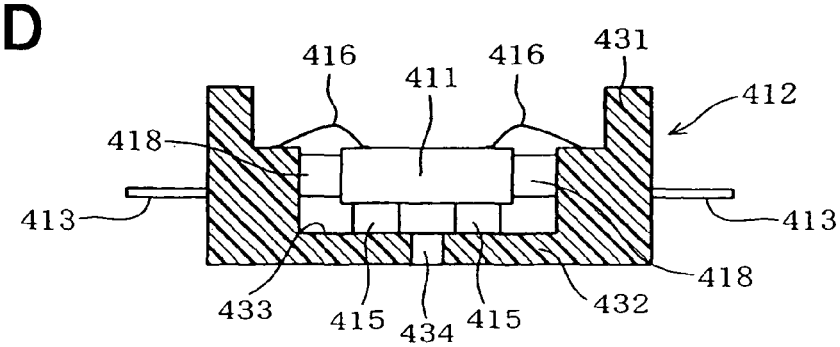

Then, as shown in FIG. 26D, the inner unit 411 and the casing 412 are electrically connected together through the bonding wire 416. Then, a cover (not shown) is attached to the casing 412, and the lead frame 413 is formed in a predetermined shape. In this way, the physical quantity sensor 410 is completed. It is noted that the casing 412 has the opening 434. Therefore, like the ninth embodiment, a jig (not shown) can be used to make the physical quantity sensor 410 by inserting the jig in the opening 434.

In the above example, the bonding wire 16 is connected, after the material for the second vibration isolator 418 is injected and cures. Alternatively, the bonding wire 16 can be connected, before the material for the 1 second vibration isolator 418 is injected.

As described above, according to the fifteenth embodiment, the first and second vibration isolators 415, 418 are located between the inner unit 411 and the casing 412. The first vibration isolator 415 is located between the second end surface 426 of the inner unit 411 and the supporting surface 433 of the casing 412. The inner unit 411 is not in direct contact with the casing 412. The first vibration isolator 415 absorbs the relative vibration between the inner unit 411 and the casing 412 while joining the inner unit 411 to the casing 412. The second vibration isolator 418 has an elastic modulus smaller than that of the first vibration isolator 415. Thus, the second vibration isolator 418 can reduce a vibration having a frequency lower than a frequency of a vibration the first vibration isolator 415 reduces. The relative vibration between the inner unit 411 and the casing 412 contains a high frequency vibration and a low frequency vibration. The first vibration isolator 415 can reduce the high frequency vibration, and the second vibration isolator 418 can reduce the low frequency vibration. Therefore, the relative vibration between the inner unit 411 and the casing 412 can be reduced over a wide frequency range.

Further, according to the fifteenth embodiment, the second vibration isolator 418 is located to limit a change in distance between the first junction between the inner unit 411 and the bonding wire 416 and the second junction between the casing 412 and the bonding wire 416. In such an approach, the tensile and compressive forces applied to the bonding wire 416 are reduced so that reliability of the electrical connection between the inner unit 411 and the casing 412 can be improved.

A liquid or a semi-solid material such as a rubber or a gel containing oil is injected between the inner unit 411 and the casing 412. The injected material cures to form the second vibration isolator 418. Thus, the second vibration isolator 418 can be easily formed between the inner unit 411 and the casing 412. The material for the second vibration isolator 418 has a small elastic modulus than the elastomer for the first vibration isolator 415 so that the second vibration isolator 418 can be softer than the first vibration isolator 415. Thus, the first and second vibration isolators 415, 418 have different vibration damping properties so that the relative vibration between the inner unit 411 and the casing 412 can be reduced over a wide frequency range.

According to the fifteenth embodiment, after the inner unit 411 is attached to the casing 412 to which the elastomer for the first vibration isolator 415 is applied, the material for the second vibration isolator 418 is injected between the inner unit 411 and the casing 412. That is, the physical quantity sensor 410 is made by application of the first vibration isolator 415 to the casing 412, attachment of the inner unit 411 to the casing 412, and injection of the second vibration isolator 418 between the inner unit 411 and the casing 412. In this way, the physical quantity sensor 410 can be made through simple manufacturing steps. The bonding wire 416 is connected between the inner unit 411 and the lead frame 413 after or before the injection of the second vibration isolator 418. When the bonding wire 416 is connected after the injection of the second vibration isolator 418, a manufacturing step for injecting the second vibration isolator 418 and a manufacturing step for connecting the bonding wire 416 can be performed without interference with each other. In contrast, when the bonding wire 416 is connected before the injection of the second vibration isolator 418, the first and second junctions between the bonding wire 416 and each of the inner unit 411 and the lead frame 413 can be covered with the second vibration isolator 418. Thus, the first and second junctions can be reinforced by the second vibration isolator 418 and also protected from damage such as corrosion.

(Sixteenth Embodiment)

A physical quantity sensor 410 according to a sixteenth embodiment of the present invention is described below with reference to FIG. 27. The sixteenth embodiment is a modification of the fifteenth embodiment. A difference between the fifteenth and sixteenth embodiments is as follows.

In the sixteenth embodiment, the second vibration isolator 418 is located around the first vibration isolator 415. A liquid or a semi-solid material (e.g., rubber or gel) for the second vibration isolator 418 is injected between the outer side wall 429 of the inner unit 411 and the inner side wall 435 of the casing 412. If the viscosity of the material is small, the material slips off between the outer side wall 429 and the inner side wall 435 due to its weight. As a result, the material moves around the first vibration isolator 415 and cures there to form the second vibration isolator 418. In this way, the second vibration isolator 418 is located around the first vibration isolator 415. Even when the second vibration isolator 418 is located around the first vibration isolator 415, the second vibration isolator 418 can reduce the vibration between the inner unit 411 and the casing 412 and also can limit a change in distance between the first and second junctions to reduce the tensile and compressive forces applied to the bonding wire 416.

Figure 27:
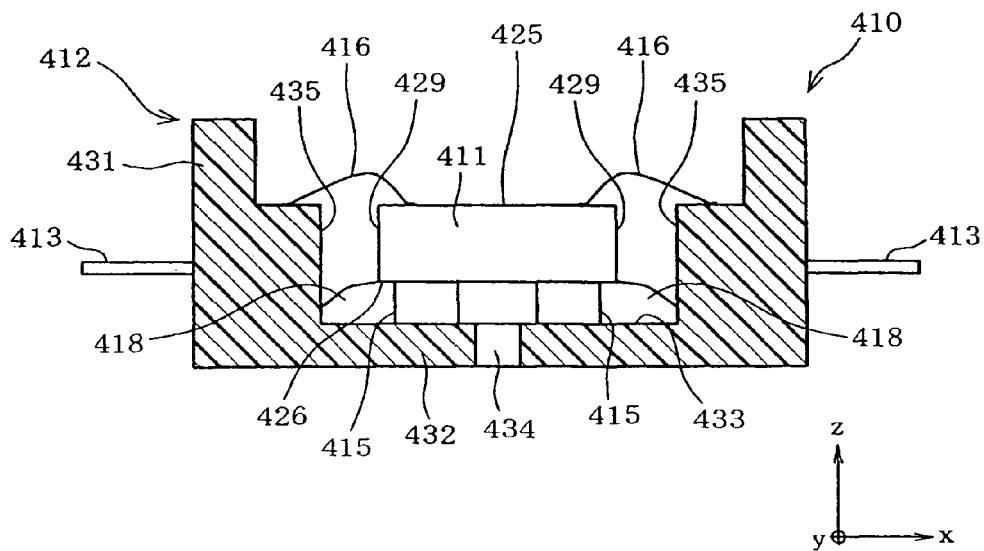
FIG. 27 is a diagram illustrating a cross-sectional view of a physical quantity sensor according to a sixteenth embodiment of the present invention.

In FIG. 27, the second vibration isolator 418 is not located between the first vibration isolators 415, each of which is located at a corner of the inner unit 411. Alternatively, the second vibration isolator 418 can be located between the first vibration isolators 415. That is, there is no need to control flow of the liquid or semi-solid material to form the second vibration isolator 418.

(Seventeenth Embodiment)

Figure 28:
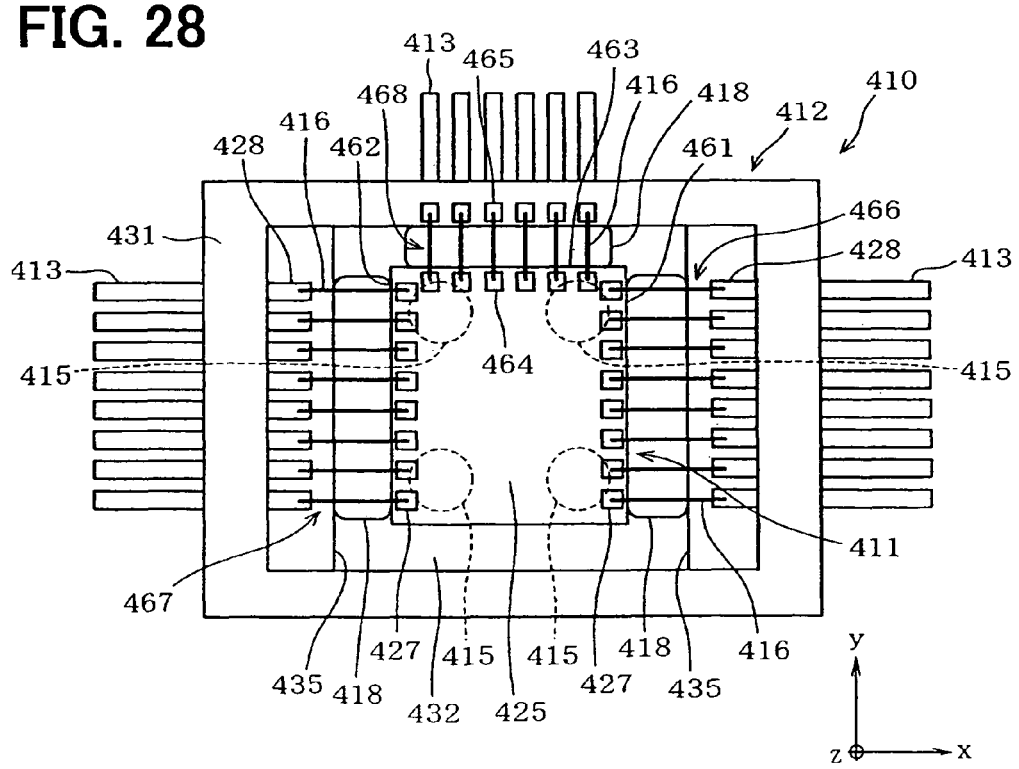
FIG. 28 is a diagram illustrating a plan view of a physical quantity sensor according to a seventeenth embodiment of the present invention.

A physical quantity sensor 410 according to a seventeenth embodiment of the present invention is described below with reference to FIG. 28. In the preceding embodiments, the bonding wire is provided on a pair of opposing sides of the rectangular inner unit. In the seventeenth embodiment, the bonding wire 416 is provided on a side 463 of the rectangular inner unit 411 in addition to a pair of opposing sides 461, 462 of the rectangular inner unit 411. The side 463 is located between the sides 461, 462 to connect the sides 461, 462. A pad 464 is formed on the side 463 of the inner unit 411, and a pad 465 is formed on the casing 412 to be located opposite to the pad 464. The pads 464, 465 are electrically connected together through the bonding wire 416. Multiple bonding wires 416 are arranged in parallel on the side 461 to form an electrical connection region 466, multiple bonding wires 416 arranged in parallel on the side 462 to form an electrical connection region 467, and multiple bonding wires 416 are arranged in parallel on the side 463 to form an electrical connection region 468. Since three electrical connection regions 466-468 are formed, three second vibration isolator 418 are provided. The second vibration isolators 418 extend to outside the electrical connection regions 466, 467, 468, respectively.

As described above, according to the seventeenth embodiment, the second vibration isolator 418 is provided on each side of the inner unit 411 where the electrical connection region is formed. In such an approach, a change in distance between the first junction between the inner unit 411 and the bonding wire 416 and the second junction between the casing 412 and the bonding wire 416 is reduced so that the tensile and compressive forces applied to the bonding wire 416 can be reduced. Accordingly, reliability of the electrical connection between the inner unit 411 and the casing 412 can be improved.

(Eighteenth Embodiment)

Figure 29:
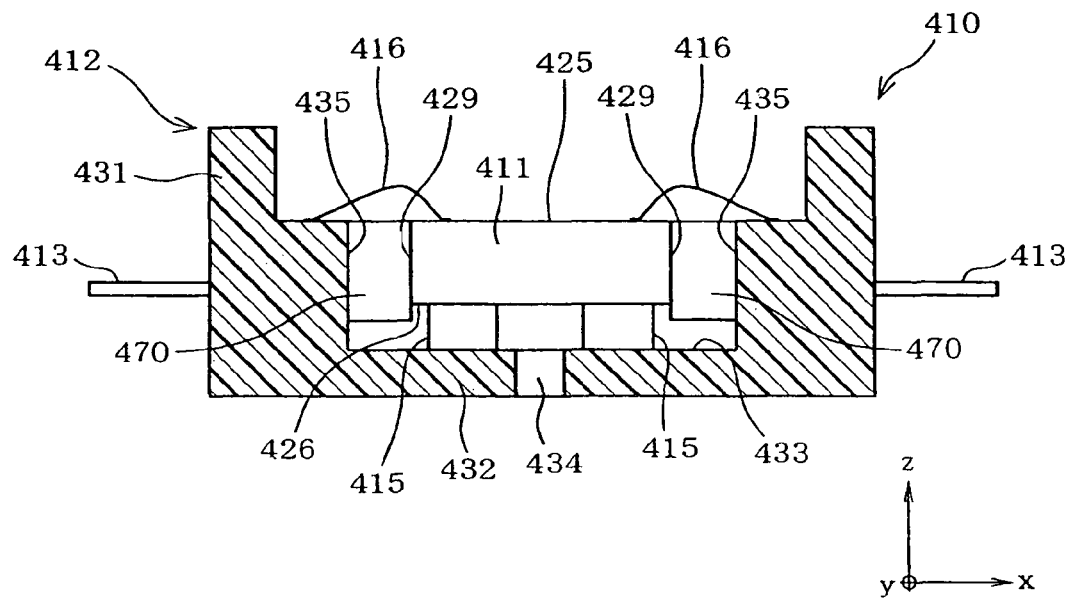
FIG. 29 is a diagram illustrating a cross-sectional view of a physical quantity sensor according to an eighteenth embodiment of the present invention.

A physical quantity sensor 410 according to an eighteenth embodiment of the present invention is described below with reference to FIG. 29. The eighteenth embodiment is similar to the fifteenth embodiment. A difference between the fifteenth and eighteenth embodiments is that a second vibration isolator 470 of the eighteenth embodiment is preformed to have a predetermined shape. The second vibration isolator 470 has an elastic modulus smaller than that of the first vibration isolator 415 and has the thickness corresponding to the distance between the inner unit 411 and the casing 412. Specifically, the second vibration isolator 470 has the thickness slightly greater than the distance between the inner unit 411 and the casing 412.

Figure 30A:
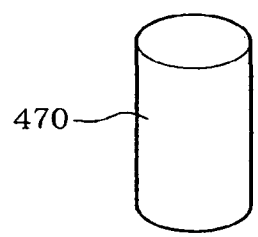
FIGS. 30A-30D are diagrams illustrating a second vibration isolator of the physical quantity sensor of the eighteenth embodiment.
Figure 30B:
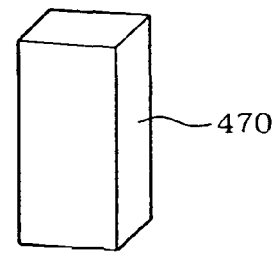
Figure 30C:
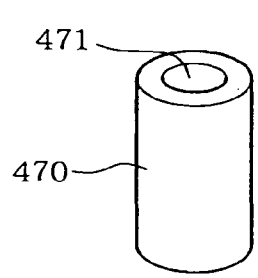
Figure 30D:
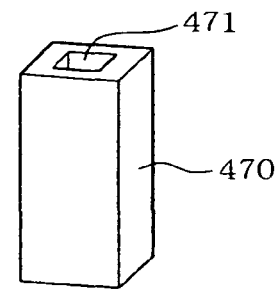

Like the fifteenth embodiment, the second vibration isolator 470 can be made of a rubber having a small elastic modulus or a gel containing oil. The second vibration isolator 470 is not limited to a specific shape. For example, the second vibration isolator 470 can have a cylindrical shape as shown in FIG. 30A, a rectangular cylindrical shape as shown in FIG. 30B, a hollow cylindrical shape with a cylindrical opening 471 as shown in FIG. 30C, or a hollow rectangular cylindrical shape with a rectangular cylindrical opening 471 as shown in FIG. 30D. The second vibration isolator 470 can be made of a porous foam material so that the second vibration isolator 470 can have a lot of bubbles (i.e., holes).

Figure 31A:
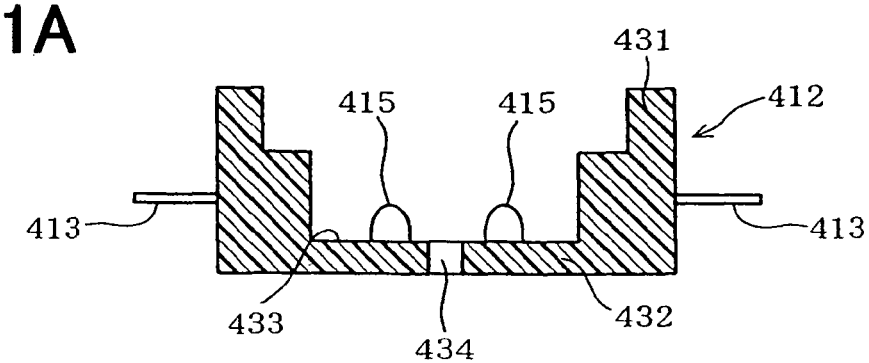
FIGS. 31A-31D are diagrams illustrating a method of making the physical quantity sensor of the eighteenth embodiment.
Figure 31B:
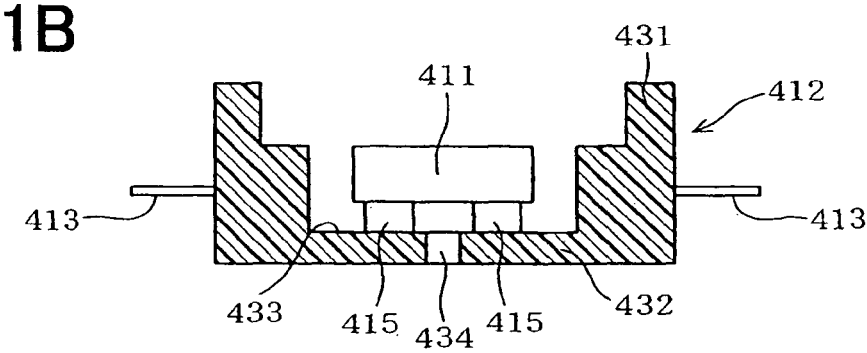

An example of a method of making the physical quantity sensor 410 of the eighteenth embodiment is described below with reference to FIGS. 31A-31D. Firstly, as shown in FIG. 31A, the lead frame 413 is insert-molded with the casing 412 so that the casing 412 and the lead frame 413 can be joined together. Further, elastomer for the first vibration isolator 415 is applied to the supporting surface 433 of the supporting portion 432. Then, as shown in FIG. 31B, the inner unit 411 is attached to the casing 412 through the elastomer, before the elastomer cures. When the elastomer cures to form the first vibration isolator 415, the inner unit 411 is supported to the casing 412 through the first vibration isolator 415.

Figure 31C:
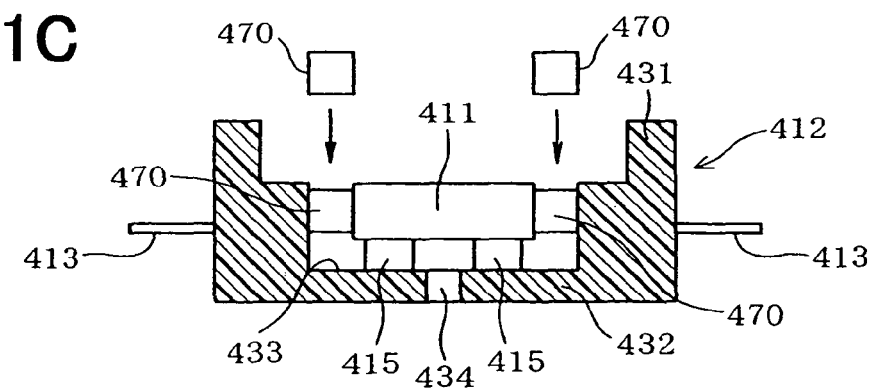

After the elastomer cures to form the first vibration isolator 415, the second vibration isolator 418 that is preformed to have a predestined shape is placed between the inner unit 411 and the casing 412 as shown in FIG. 31C. Specifically, the preformed second vibration isolator 418 has the thickness slightly greater than the distance between the outer side wall 429 of the inner unit 411 and the inner side wall 435 of the casing 412 and pressed in between the outer side wall 429 and the inner side wall 435. Thus, the second vibration isolator 418 can remain between the outer side wall 429 and the inner side wall 435.

Figure 31D:
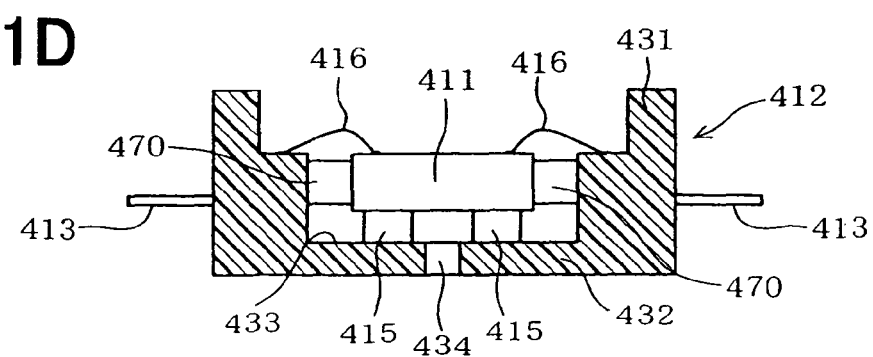

Then, as shown in FIG. 31D, the inner unit 411 and the casing 412 are electrically connected together through the bonding wire 416. Then, a cover (not shown) is attached to the casing 412, and the lead frame 413 is formed in a predetermined shape. In this way, the physical quantity sensor 410 is completed. It is noted that the casing 412 has the opening 434. Therefore, like the ninth embodiment, a jig (not shown) can be used to make the physical quantity sensor 410 by inserting the jig in the opening 434. It is preferable that a manufacturing step for connecting the bonding wire 416 between the inner unit 411 and the lead frame 413 be performed before a manufacturing step for placing the second vibration isolator 470 between the inner unit 411 and the casing 412. In such an approach, the manufacturing step for placing the second vibration isolator 470 can be easily performed.

As described above, according to the eighteenth embodiment, after the inner unit 411 is attached to the casing 412 to which the elastomer for the first vibration isolator 415 is applied, the preformed second vibration isolator 470 is pressed in between the inner unit 411 and the casing 412. That is, the physical quantity sensor 410 is made by application of the first vibration isolator 415 to the casing 412, attachment of the inner unit 411 to the casing 412, and press of the second vibration isolator 418 in between the inner unit 411 and the casing 412. In this way, the physical quantity sensor 410 can be made through simple manufacturing steps. Further, since the second vibration isolator 470 is preformed, each second vibration isolator 470 can have an uniform damping property.

The second vibration isolator 470 can have a hollow shape with the opening 471 as shown in FIGS. 30C and 30D. In such an approach, the second vibration isolator 470 becomes softer and thus reduces the low frequency vibration more effectively. The number, shape, and arrangement of the opening 471 can be adjusted according to the frequency of the vibration to be reduced. Thus, the second vibration isolator 470 can reduce the vibration over a wide frequency range.

(Nineteenth Embodiment)

Figure 32:
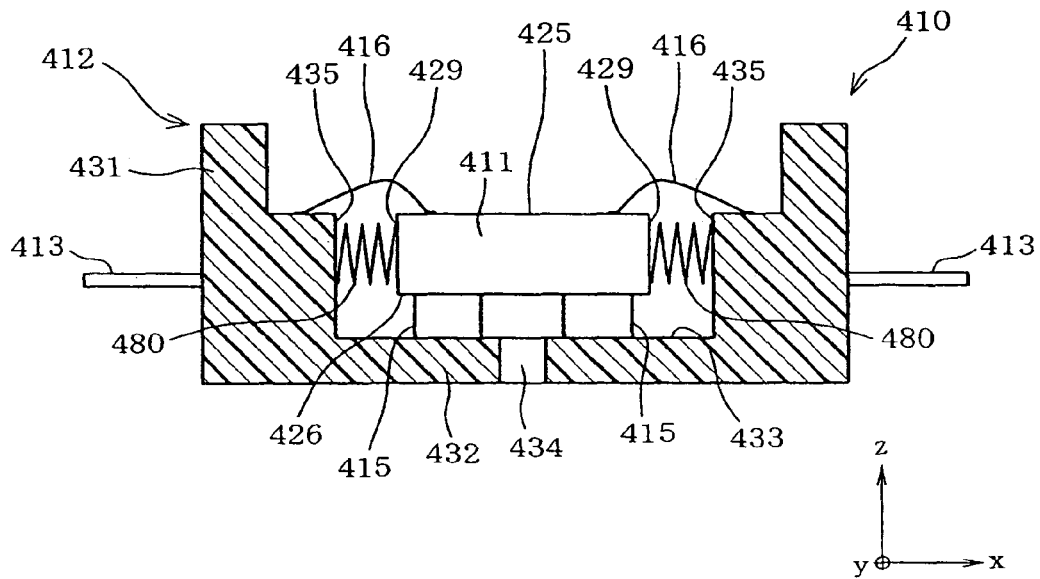
FIG. 32 is a diagram illustrating a cross-sectional view of a physical quantity sensor according to a nineteenth embodiment of the present invention.

A physical quantity sensor 410 according to a nineteenth embodiment of the present invention is described below with reference to FIG. 32. A difference between the eighteenth and nineteenth embodiments is as follows.

In the nineteenth embodiment, the physical quantity sensor 410 includes a metal spring 480 having a predetermined shape instead of the preformed second vibration isolator 470 of the eighteenth embodiment.

Like the second vibration isolator 470, the metal spring 480 is placed between the inner unit 411 and the casing 412, after the inner unit 411 is attached to the casing 412 through the first vibration isolator 415. Specifically, the metal spring 480 has the total length slightly greater than the distance between the outer side wall 429 of the inner unit 411 and the inner side wall 435 of the casing 412 and pressed in between the outer side wall 429 and the inner side wall 435. Thus, the metal spring 480 can remain between the outer side wall 429 and the inner side wall 435.

As described above, according to the eighteenth embodiment, after the inner unit 411 is attached to the casing 412 to which the elastomer for the first vibration isolator 415 is applied, the metal spring 480 is pressed in between the inner unit 411 and the casing 412. That is, the physical quantity sensor 410 is made by application of the first vibration isolator 415 to the casing 412, attachment of the inner unit 411 to the casing 412, and press of the metal spring 480 in between the inner unit 411 and the casing 412. In this way, the physical quantity sensor 410 can be made through simple manufacturing steps. It is preferable that a manufacturing step for connecting the bonding wire 416 between the inner unit 411 and the lead frame 413 be performed before a manufacturing step for placing the metal spring 480 between the inner unit 411 and the casing 412. In such an approach, the manufacturing step for placing the metal spring 480 can be easily performed. Further, since the metal spring 480 is preformed to have a predetermined shape, each metal spring 480 can have an uniform damping property according to the frequency of the vibration to be reduced.

A physical quantity sensor 410 according to a twentieth embodiment of the present invention is described below with reference to FIG. 33.

Figure 33:
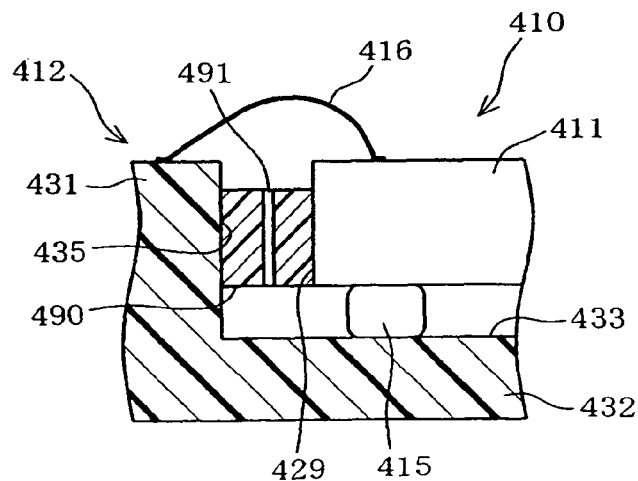
FIG. 33 is a diagram illustrating a main portion of a physical quantity sensor according to a twentieth embodiment of the present invention.

In the twentieth embodiment, as shown in FIG. 33, the physical quantity sensor 410 includes a pair of second vibration isolators 490. The second vibration isolators 490 are located between the inner unit 411 and provide a clearance 491 therebetween. That is, the total thickness of the second vibration isolators 490 is slightly smaller than the distance between the inner unit 411 and the casing 412. One second vibration isolator 490 is joined to the inner side wall 435 of the casing 412, and the other second vibration 490 is joined to the outer side wall 429 of the inner unit 411.

To ensure the electrical connection between the inner unit 411 and the casing 412 (i.e., lead frame 413), there is a need to reduce a low frequency vibration with a relatively large amplitude. The clearance 491 prevents a wiggle (i.e., high frequency) vibration having a relatively small amplitude from being transmitted between the inner unit 411 and the casing 412. When a low frequency vibration with a large amplitude occurs, the second vibration isolators 490 facing each other come in contact with each other, thereby reducing the low frequency vibration transmitted between the inner unit 411 and the casing 412. In this way, the clearance 491 can reduce the vibration over a wide frequency range.

Figure 34:
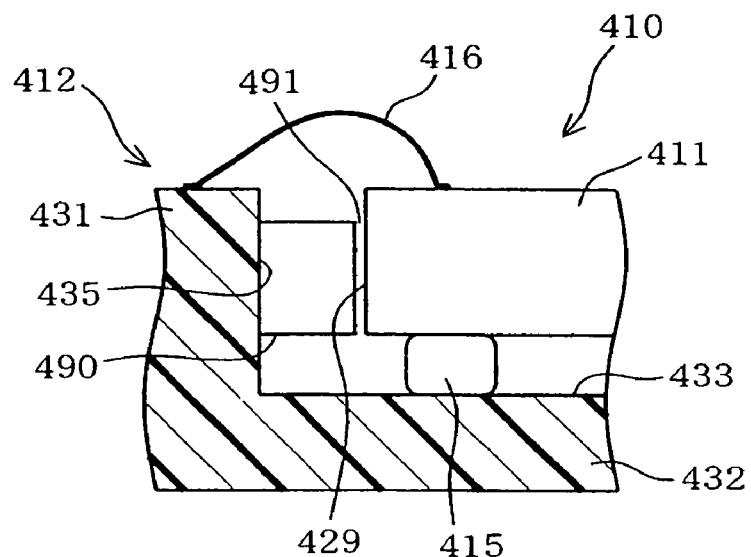
FIG. 34 is a diagram illustrating a main portion of a physical quantity sensor according to a modification of the twentieth embodiment.
Figure 35:
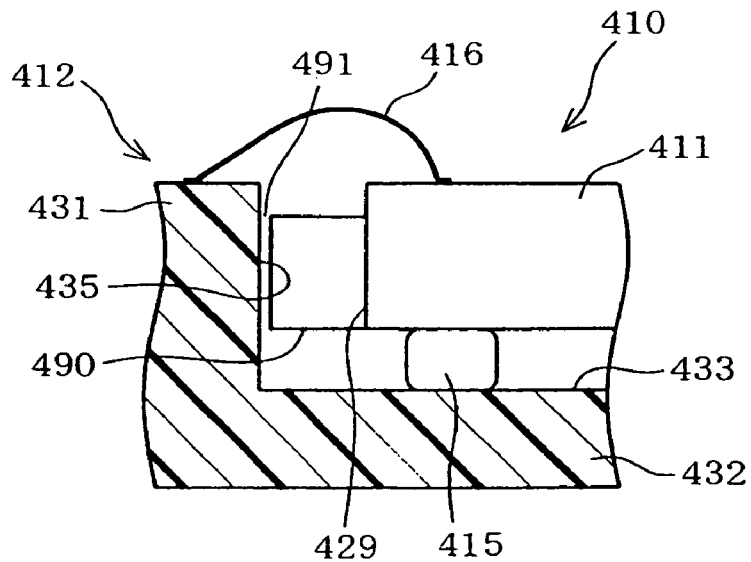
FIG. 35 is a diagram illustrating a main portion of a physical quantity sensor according to another modification of the twentieth embodiment.

Modifications of the twentieth embodiment are described below with reference to FIGS. 34 and 35. In a modification shown in FIG. 34, one second vibration isolator 490 is joined to the inner side wall 435 of the casing 412 at one end and spaced from the outer side wall 429 of the inner unit 411 at the other end. The second vibration isolator 490 has the thickness slightly smaller than the distance between the inner unit 411 and the casing 412 so that the clearance 491 can be formed between the inner unit 411 and the second vibration isolator 490. In another modification shown in FIG. 35, one second vibration isolator 490 is joined to the outer side wall 429 of the inner unit 411 at one end and spaced from the inner side wall 435 of the casing 412 at the other end. The second vibration isolator 490 has the thickness slightly smaller than the distance between the inner unit 411 and the casing 412 so that the clearance 491 can be formed between the inner unit 411 and the second vibration isolator 490. In this way, the second vibration isolator 490 can be located between the inner unit 411 and the casing 412 to have both a fixed end and a free end.

Such changes and modifications are to be understood as being within the scope of the present invention as defined by the appended claims.

What is claimed is:

1. A physical quantity sensor comprising
a sensor portion;
a casing having an inner wall that defines an inner space for holding the sensor portion, the inner wall spaced from the sensor portion to form a clearance therebetween;
a vibration isolator located in the clearance to join the sensor portion to the casing, the vibration isolator configured to reduce a relative vibration between the sensor portion and the casing; and
a lead frame configured to electrically connect an inside and an outside of the casing,
wherein
the sensor portion includes a capacitive sensor chip having a movable electrode and a fixed electrode,
the movable electrode is configured to be displaced in a direction of the clearance between the sensor portion and the casing, and
the fixed electrode is located to face the movable electrode,
the sensor portion further includes a package with an entrance, a lid for covering the entrance of the package,
the sensor chip is held in the package and located on an inner bottom surface of the package, and
the vibration isolator is in contact with an outer side surface of the package and is not in contact with an outer bottom surface of the package.

2. The physical quantity sensor according to claim 1, wherein
the clearance surrounds the sensor portion, and
the vibration isolator partially fills the clearance.

3. The physical quantity sensor according to claim 1, wherein the vibration isolator is made of an elastomer.

4. A physical quantity sensor comprising:
a sensor portion;
a casing having an inner wall that defines an inner space for holding the sensor portion, the inner wall spaced from the sensor portion to form a clearance therebetween; and
a vibration isolator located in the clearance to join the sensor portion to the casing, the vibration isolator configured to reduce a relative vibration between the sensor portion and the casing,
wherein
the sensor portion includes a capacitive sensor chip having a movable electrode and a fixed electrode,
the movable electrode is configured to be displaced in a direction of the clearance between the sensor portion and the casing,
the fixed electrode is located to face the movable electrode,
the sensor portion further includes a package for holding the sensor chip,
the vibration isolator is located between an outer side surface of the package and the casing,
an outer bottom surface of the package is spaced from the casing,
the sensor portion further includes a signal processing chip for processing an output signal of the sensor chip, the signal processing chip having first and second surfaces opposite to each other,
the first surface of the signal processing chip is fixed to an inner bottom surface of the package through a first adhesive, and
the sensor chip is fixed to the second surface of the signal processing chip through a second adhesive.

5. The physical quantity sensor according to claim 4, wherein
the clearance surrounds the sensor portion, and
the vibration isolator partially fills the clearance.

6. The physical quantity sensor according to claim 4, wherein the vibration isolator is made of an elastomer.

* * * * *